United States Patent
Chang et al.

(10) Patent No.: US 9,240,419 B2
(45) Date of Patent: Jan. 19, 2016

(54) THREE-DIMENSIONAL SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Sung-Il Chang, Hwaseseong-si (KR); Changhyun Lee, Suwon-si (KR); Byoungkeun Son, Suwon-si (KR); Jin-Soo Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/515,997

(22) Filed: Oct. 16, 2014

(65) Prior Publication Data
US 2015/0037951 A1      Feb. 5, 2015

Related U.S. Application Data

(63) Continuation of application No. 13/366,057, filed on Feb. 3, 2012, now Pat. No. 8,872,183.

(30) Foreign Application Priority Data

Feb. 7, 2011    (KR) ........................ 10-2011-0010729

(51) Int. Cl.
*H01L 21/00*      (2006.01)
*H01L 27/115*     (2006.01)
*H01L 29/423*     (2006.01)
(Continued)

(52) U.S. Cl.
CPC .... *H01L 27/11582* (2013.01); *H01L 21/02532* (2013.01); *H01L 21/02595* (2013.01); *H01L 21/31111* (2013.01); *H01L 21/8221* (2013.01); *H01L 27/0688* (2013.01); *H01L 27/11556* (2013.01); *H01L 29/4232* (2013.01); *H01L 29/42372* (2013.01)

(58) Field of Classification Search
CPC .................. H01L 27/11578; H01L 29/66833; H01L 27/1151; H01L 29/4236; H01L 29/7813; H01L 21/28282; H01L 29/792; H01L 21/8221; H01L 27/0688; H01L 29/66734
USPC .......................................... 438/216, 261, 287
See application file for complete search history.

(56) References Cited

U.S. PATENT DOCUMENTS 8,120,961 B2    2/2012    Katsumata et al. ...... 365/185.18
8,278,170 B2    10/2012   Lee et al. ..................... 438/261
(Continued)

FOREIGN PATENT DOCUMENTS

JP      2010-021191      1/2010
JP      2010-118530      5/2010
(Continued)

*Primary Examiner* — Minh-Loan Tran
(74) *Attorney, Agent, or Firm* — Myers Bigel Sibley & Sajovec, P.A.

(57) ABSTRACT

Three-dimensional semiconductor devices are provided. The three-dimensional semiconductor device includes a substrate, a buffer layer on the substrate. The buffer layer includes a material having an etching selectivity relative to that of the substrate. A multi-layer stack including alternating insulation patterns and conductive patterns is provided on the buffer layer opposite the substrate. One or more active patterns respectively extend through the alternating insulation patterns and conductive patterns of the multi-layer stack and into the buffer layer. Related fabrication methods are also discussed.

5 Claims, 31 Drawing Sheets

(51) Int. Cl.
*H01L 21/822* (2006.01)
*H01L 27/06* (2006.01)
*H01L 21/02* (2006.01)
*H01L 21/311* (2006.01)

(56) References Cited

U.S. PATENT DOCUMENTS

| 8,395,190 | B2 | 3/2013 | Shim et al. | 257/208 |
| 8,409,977 | B2 | 4/2013 | Shim et al. | 438/589 |
| 2010/0118610 | A1 | 5/2010 | Katsumata et al. | |
| 2010/0163968 | A1* | 7/2010 | Kim et al. | 257/324 |
| 2010/0181612 | A1 | 7/2010 | Kito et al. | |
| 2011/0147824 | A1* | 6/2011 | Son et al. | 257/324 |

FOREIGN PATENT DOCUMENTS

| JP | 2010-171185 | 8/2010 |
| KR | 1020100054100 A | 5/2010 |
| KR | 1020100084192 A | 7/2010 |
| KR | 1020100086435 A | 7/2010 |

\* cited by examiner

THREE-DIMENSIONAL SEMICONDUCTOR DEVICES AND METHODS OF FABRICATING THE SAME

CROSS-REFERENCE TO RELATED APPLICATIONS

This U.S. non-provisional patent application claims the benefit of priority as a continuation of U.S. application Ser. No. 13/366,057, filed Feb. 3, 2012, which claims priority under 35 U.S.C. §119 from Korean Patent Application No. 10-2011-0010729, filed on Feb. 7, 2011, the disclosure of which is hereby incorporated by reference herein in its entirety.

BACKGROUND

The present inventive concepts relate to semiconductor devices and methods of fabricating the same and, more particularly, to three-dimensional semiconductor devices and methods of fabricating the same.

Three-dimensional integrated circuit (3D-IC) semiconductor technologies have been proposed to increase a memory capacity of semiconductor memory devices. 3D-IC technologies may refer to techniques that relate to fabrication processes and design schemes for three dimensionally arraying a plurality of memory cells. The memory capacity may also be increased using other technologies, for example, a technology for forming fine and small patterns or a technology for realizing multi-level cells.

Recently, a punch-and-plug technology has been introduced as one of the 3D-IC technologies. The punch-and-plug technology includes a process step of sequentially forming a plurality of material layers on a substrate and a step of forming plugs that penetrate the plurality of material layers. This punch-and-plug technology may be attractive to the semiconductor industry since the memory capacity can be improved without a substantial increase in fabrication costs.

SUMMARY

Exemplary embodiments are directed to three-dimensional semiconductor devices and methods of fabricating the same.

According to some embodiments, a semiconductor device includes a buffer layer on a substrate, where the buffer layer includes a material having an etching selectivity relative to that of the substrate. A multi-layer stack including alternating insulation patterns and conductive patterns is provided on the buffer layer opposite the substrate. One or more active patterns respectively extend through the alternating insulation patterns and conductive patterns of the multi-layer stack and into the buffer layer.

In some embodiments, the active patterns may be confined above the substrate. The active patterns may respectively extend into the buffer layer to a same or uniform depth.

In some embodiments, the material of the buffer layer may have a lower etch rate than that of the substrate.

In some embodiments, the buffer layer may include a buried insulation layer on the surface of the substrate, and a semiconductor layer on the buried insulation layer opposite the substrate. The active patterns may extend through the semiconductor layer and at least partially into the buried insulation layer.

In some embodiments, a thickness of the buried insulation layer may be less than or equal to a thickness of the semiconductor layer. The active patterns may extend completely through the buried insulation layer to contact the substrate.

In some embodiments, a thickness of the buried insulation layer may be greater than a thickness of the semiconductor layer. A portion of the buried insulation layer may separate the active patterns from the substrate.

In some embodiments, an opening in the semiconductor layer through which the active pattern extends may be narrower than an opening in the buried insulation layer into which the active pattern extends.

In some embodiments, the semiconductor layer may include a doped region therein that defines a common source line. The common source line may be insulated from the substrate by the buried insulation layer.

In some embodiments, the active pattern may include a first active layer on sidewalls of a trench extending through the multi-layer stack into the buffer layer, and a second active layer on the first layer. The first active layer may be confined above the buried insulation layer, and the second active layer may extend into the buried insulation layer.

In some embodiments, portions of the second active layer may extend between the sidewalls of the trench and the first active layer.

In some embodiments, the buffer layer may be a carbon-containing polysilicon layer having a lower etch rate than the substrate.

In some embodiments, an isolating pattern comprising an insulating material may extend through the insulation patterns and conductive patterns of the multi-layer stack between adjacent ones of the active patterns. The isolating pattern and a doped region of the buffer layer may overlap in plan view.

In some embodiments, the isolating pattern may be closer to one of the adjacent ones of the active patterns than another. Also, the buried insulation layer may have a nonlinear or zigzag shape in plan view, and may not overlap with the isolating pattern in plan view.

In some embodiments, the conductive patterns may be gate electrodes of a string of serially connected transistors having respective source and drain regions in the active pattern.

In some embodiments, the semiconductor device may be a NAND flash memory device. A bit line may be provided on the multi-layer stack opposite the substrate and electrically contacting the active patterns. The conductive patterns may define selection lines and word lines of the memory device, and the string of serially connected transistors may include selection transistors and memory cell transistors serially connected between the selection transistors.

According to further embodiments, a three-dimensional semiconductor memory device includes a buffer layer on a substrate, where the buffer layer includes a material having an etch selectivity with respect to the substrate. A plurality of conductive patterns and interlayer insulation patterns are alternately stacked on the buffer layer. The conductive patterns define selection lines and word lines of the memory device. Active patterns penetrate the conductive patterns and the interlayer insulation patterns to contact the buffer layer at a uniform depth. The conductive patterns provide gate electrodes of a string of serially connected transistors having respective source and drain regions in the active patterns. An isolating insulation pattern penetrates the conductive patterns and the interlayer insulation patterns between adjacent ones of the active patterns to contact a doped region of the buffer layer. The doped region defines a common source line of the memory device. A bit line extends on the conductive patterns and the interlayer insulation patterns opposite the substrate and electrically contacts the active patterns.

According to other embodiments, a three-dimensional semiconductor device includes a buffer layer on a substrate, a plurality of conductive patterns sequentially stacked on the buffer layer, interlayer insulation patterns in respective ones of spaces between the conductive patterns, and active patterns penetrating the conductive patterns and the interlayer insulation patterns to contact the buffer layer. The buffer layer includes a material having an etch selectivity with respect to the substrate.

In some embodiments, the buffer layer may include a buried insulation layer on the substrate and a semiconductor layer on the buried insulation layer opposite the substrate.

In some embodiments, the lower portions of the active patterns may be disposed in the buried insulation layer, and each of the lower portions of the active patterns may have an anchor-shaped cross sectional view.

In some embodiments, the device may further include common source lines disposed in the semiconductor layer.

In some embodiments, bottom surfaces of the active patterns may contact the substrate.

In some embodiments, a thickness of the buried insulation layer may be equal to or less than a thickness of the semiconductor layer.

In some embodiments, portions of the buried insulation layer may be disposed between the active patterns and the substrate.

In some embodiments, the device may further include an isolating insulation pattern penetrating the conductive patterns and the interlayer insulation patterns to be in contact with the buffer layer and to be spaced apart from the active patterns, and the buried insulation layer may overlap with the isolating insulation pattern in a plan view.

In some embodiments, the device may further include an isolating insulation pattern penetrating the conductive patterns and the interlayer insulation patterns to be in contact with the buffer layer and to be spaced apart from the active patterns, and the buried insulation layer may not overlap with the isolating insulation pattern in a plan view.

In some embodiments, the device may further include an isolating insulation pattern penetrating the conductive patterns and the interlayer insulation patterns to be in contact with the buffer layer and to be spaced apart from the active patterns. A distance between the isolating insulation pattern and one of the active patterns may be different from a distance between the isolating insulation pattern and another active pattern, and the buried insulation layer may surround the lower portions of the active patterns and may have a zigzag or other nonlinear shape in a plan view.

In some embodiments, the semiconductor layer may include a polysilicon layer or a single crystalline silicon layer.

In some embodiments, the buffer layer may be a polysilicon layer doped with carbon.

In some embodiments, bottom surfaces of the active patterns may be located at a lower level than a top surface of the buffer layer.

In some embodiments, the buffer layer may have a lower etch rate than the substrate.

In still further embodiments, a method of forming a semiconductor device includes forming a buffer layer on a substrate, alternately stacking sacrificial layers and interlayer insulation layers on the buffer layer, patterning at least the sacrificial layers and the interlayer insulation layers to form respective openings exposing the buffer layer, forming gate insulation layers on sidewalls of the respective openings and protection spacers on the gate insulation layers, removing lower portions of the gate insulation layers to expose lower sidewalls of the respective openings, forming an active layer in the respective openings, and replacing the sacrificial layers with conductive layer.

In some embodiments, forming the buffer layer may include forming a buried insulation layer on the substrate and forming a semiconductor layer on the buried insulation layer, and forming the respective openings may include patterning the sacrificial layers, the interlayer insulation layers and the semiconductor layer to expose the buried insulation layer.

In some embodiments, a first anisotropic etch of the plurality of insulation patterns and sacrificial patterns and the semiconductor layer may be performed to define preliminary openings extending into the semiconductor layer to non-uniform depths, and a second anisotropic etch of the semiconductor layer may be performed through the preliminary openings to expose the buried insulation layer and form the respective openings to substantially uniform depths.

In some embodiments, the buried insulation layer may be etched to form undercut regions in the buried insulation layer while the lower portions of the gate insulation layers are removed, and the active layer may be formed on inner surfaces of the undercut regions.

In some embodiments, the buffer layer may be formed of a polysilicon layer doped with carbon.

BRIEF DESCRIPTION OF THE DRAWINGS

The above and other features and advantages of the disclosure will become more apparent in view of the attached drawings and accompanying detailed description.

DETAILED DESCRIPTION OF THE EMBODIMENTS

Figure 1:
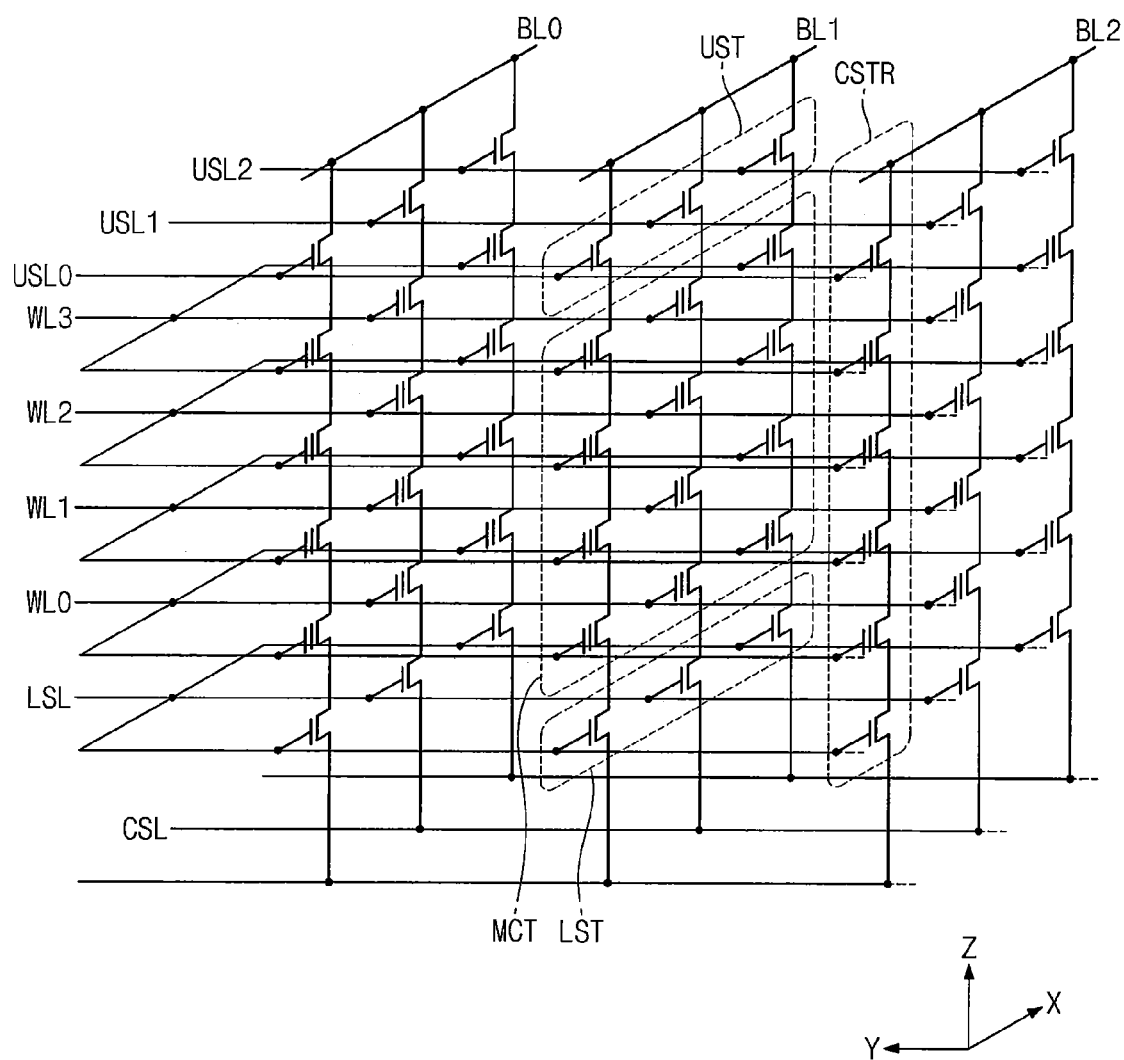
FIG. 1 is an equivalent circuit diagram illustrating a portion of a three dimensional semiconductor device according to some embodiments described herein.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," "responsive" to, or "on" another element, it can be directly coupled, connected, responsive to, or on the other element, or intervening elements may also be present. In contrast, when an element is referred to as being "directly coupled," "directly connected," "directly responsive" to, or "directly on" another element, there are no intervening elements present. As used herein the term "and/or" includes any and all combinations of one or more of the associated listed items.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
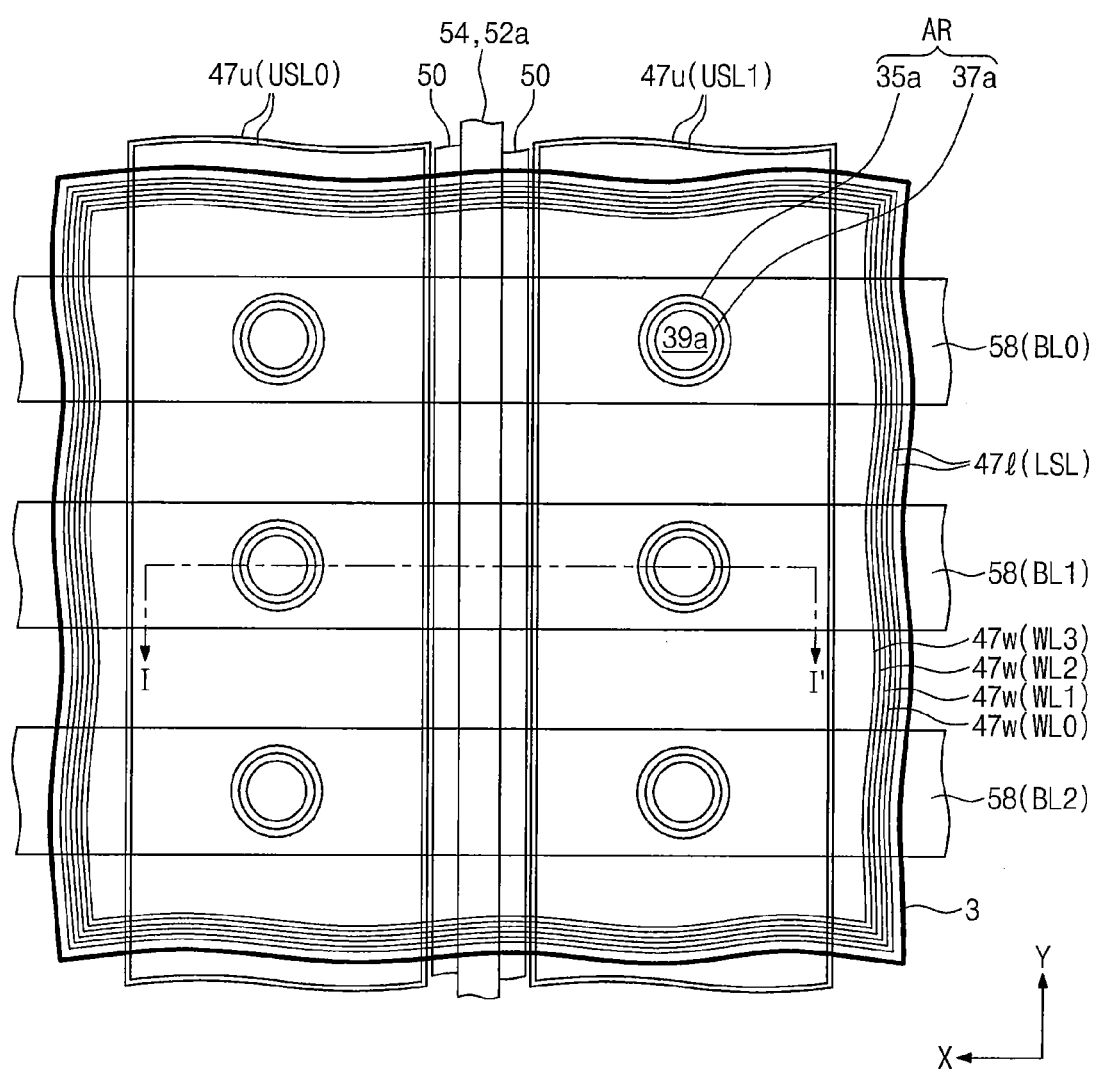
FIG. 2 is a plan view illustrating a portion of a three dimensional semiconductor device according to some embodiments described herein.
Figure 3:
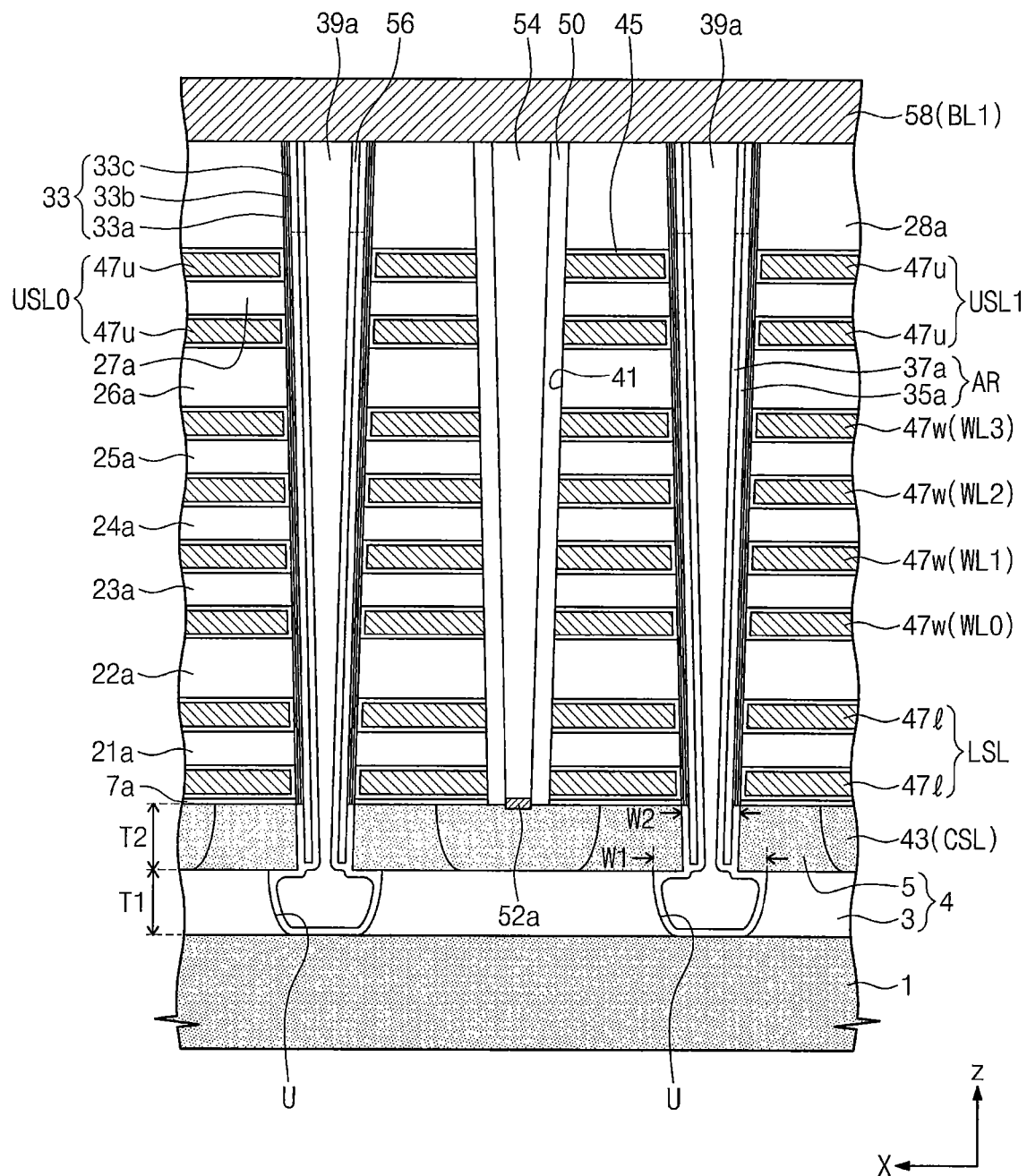
FIG. 3 is a cross sectional view taken along a line I-I' of FIG. 2.

FIG. 1 is an equivalent circuit diagram illustrating a portion of a three dimensional semiconductor device according to some embodiments, and FIG. 2 is a plan view illustrating a portion of a three dimensional semiconductor device according to some embodiments. FIG. 3 is a cross sectional view taken along a line I-I' of FIG. 2.

Referring to FIGS. 1, 2 and 3, a vertical semiconductor memory device according to exemplary embodiments may include a common source line CSL, a plurality of bit lines BL0, BL1 and BL2, and a plurality of cell strings CSTR serially connected between the common source line CSL and the bit lines BL0, BL1 and BL2.

The common source line CSL may correspond to a first impurity implantation region 43 in a buffer layer 4 on a substrate 1. The substrate 1 may correspond to a semiconductor substrate or an epitaxial semiconductor layer formed on the semiconductor substrate. The bit lines BL0, BL1 and BL2 may be conductive lines 58 disposed over and separated from the substrate 1. The bit lines BL0, BL1 and BL2 may be two dimensionally arrayed, and some of the plurality of cell strings CSTR may be electrically connected in parallel to each of the bit lines BL0, BL1 and BL2. Thus, the cell strings CSTR may be may be two dimensionally arrayed on the substrate 1. Each of the bit lines BL0, BL1 and BL2 may extend in a first direction which is parallel with an x-axis illustrated in FIGS. 1 to 3, and the common source line CSL may extend in a second direction which is parallel with a y-axis intersecting the x-axis.

Each of the cell strings CSTR may include a lower selection transistor LST connected to the common source line CSL, an upper selection transistor UST connected to one of the bit lines BL0, BL1 and BL2, and a plurality of memory cell transistors MCT serially connected to each other and disposed between the lower and upper selection transistors LST and UST. That is, the lower selection transistor LST, the plurality of memory cell transistors MCT and the upper selection transistor UST may be serially connected to each other. In addition, gate electrodes of the lower selection transistors LST may extend in the second direction to form a plurality of lower selection lines LSL, and gate electrodes of the upper selection transistors UST may also extend in the second direction to form a plurality of upper selection lines USL0 to USL2. Further, gate electrodes of the memory cell transistors MCT may also extend in the second direction to form a plurality of word lines WL0 to WL3. While the upper selection lines USL0 to USL2 may be separated from each other, the lower selection lines LSL may be electrically connected to each other, as illustrated in FIG. 1. Alternatively, the lower selection lines LSL may be separated from each other, in a manner similar to the upper selection lines USL0 to USL2 shown in FIG. 1. The word lines WL0 to WL3 may be stacked along a third direction which is parallel with a z-axis intersecting the x-axis and y-axis. The lower selection transistor LST, the plurality of memory cell transistors MCT and the upper selection transistor UST constituting each of the cell strings CSTR may also be arrayed along the third direction.

The lower selection transistors LST may be located at substantially the same level from the substrate 1, and the gate electrodes of the lower selection transistors LST may be electrically connected to each other to have the same electrical potential. Similarly, the gate electrodes of the memory cell transistors MCT located at substantially the same level from the common source lines CSL may also be electrically connected to any one of the word lines WL0 to WL3 to have the same electrical potential. Meanwhile, since each of the cell strings CSTR may include the plurality of memory cell transistors MCT located at different levels from the common source line CSL, the word lines WL0 to WL3 may also be disposed at different levels from each other.

Each of the cell strings CSTR may include an active pattern AR that vertically extends from the substrate 1 to be electrically connected to one of the bit lines BL0 to BL2. The active patterns AR may be disposed to penetrate the upper selection lines USL0 to USL2, the word lines WL0 to WL3 and the lower selection lines LSL. A gate insulation layer 33 may be disposed between the word lines WL0 to WL3 and the active patterns AR. The gate insulation layer 33 may extend between the lower selection lines LSL and the active patterns AR and/or between the upper selection lines USL0 to USL2 and the active patterns AR. In some embodiments, the gate insulation layer 33 may include a tunnel insulation layer 33c, a charge trapping layer 33b and a blocking insulation layer 33a. The charge trapping layer 33b may be absent between the lower selection lines LSL and the active patterns AR and/or between the upper selection lines USL0 to USL2 and the active patterns AR.

The lower selection transistors LST, the upper selection transistors UST and the memory cell transistors MCT may be metal-oxide-semiconductor field effect transistors (MOSFETs) that employ the active patterns AR as channel regions.

Referring again to FIGS. 2 and 3, a buffer layer 4 may be disposed on the substrate 1. The buffer layer 4 may include a material having an etch selectivity with respect to the substrate 1. In particular embodiments, the buffer layer 4 may include a buried insulation layer 3 and a semiconductor layer 5. For example, the buried insulation layer 3 may be a silicon oxide layer, and the semiconductor layer 5 may be a polysilicon layer or a single crystalline silicon layer. A thickness T1 of the buried insulation layer 3 may be less than or equal to a thickness T2 of the semiconductor layer 5.

A pad oxide pattern 7a may be disposed on the buffer layer 4. Conductive patterns 47l, 47w and 47u and interlayer insulation patterns 21a, 22a, 23a, 24a, 25a, 26a, 27a and 28a may be alternately and repeatedly stacked on the pad oxide pattern 7a to define a multi-layer stack. The substrate 1 may have a top surface which is substantially parallel with an x-y plane, and the conductive patterns 47l, 47w and 47u and the interlayer insulation patterns 21a, 22a, 23a, 24a, 25a, 26a, 27a and 28a may be stacked in the third direction perpendicular to the top surface of the substrate 1. In the event that the substrate 1 is a semiconductor substrate, a well region (not shown) may be disposed in the substrate 1. For example, a p-type well region may be disposed in the substrate 1. Each of the conductive patterns 47l, 47w and 47u may be referred to as a gate electrode, a gate pattern or an electrode pattern. Each of the conductive patterns 47l, 47w and 47u may include a doped polysilicon layer and/or a metal containing layer (e.g., a metal layer, a metal nitride layer and/or a metal silicide layer). For example, each of the conductive patterns 47l, 47w and 47u may include a polysilicon layer, a tungsten layer, a tantalum nitride layer, a titanium nitride layer, and/or a metal silicide layer.

The conductive patterns 47l may correspond to lower selection conductive patterns, and the conductive patterns 47w may correspond to word line conductive patterns. Further, the conductive patterns 47u may correspond to upper selection conductive patterns. The lower selection conductive patterns 47l may include two or more layers which are stacked and may define the lower selection line LSL, as illustrated in FIG. 3. Similarly, the upper selection conductive patterns 47u may include two or more layers which are stacked and may define the upper selection lines USL0 to USL2, as illustrated in FIG. 3. The interlayer insulation patterns 21a, 22a, 23a, 24a, 25a, 26a, 27a and 28a may be referred to as an inter-gate insulation patterns.

First impurity implantation regions 43 may be disposed in predetermined regions of the semiconductor layer 5. Each of the first impurity implantation regions 43 may have a substantially linear shape extending in the second direction. The first impurity implantation regions 43 may be heavily doped with n-type impurities. The first impurity implantation regions 43 may be electrically connected to each other at a predetermined region.

The active patterns AR may penetrate or extend through the conductive patterns 47l, 47w and 47u, the interlayer insulation patterns 21a, 22a, 23a, 24a, 25a, 26a, 27a and 28a, and the buffer layer 4 to contact the substrate 1. Each of the active patterns AR may include a first sub active pattern 35a and a second sub active pattern 37a. The first sub active pattern 35a may cover a sidewall of the gate insulation layer 33 opposite to the conductive patterns 47l, 47w and 47u. The first sub active patterns 35a of the active patterns AR may extend into the semiconductor layer 5 to protrude downwardly from a bottom surface of the gate insulation layer 33. The first sub active patterns 35a may correspond to protection spacers. The second sub active patterns 37a of the active patterns AR may be disposed between the bottom surface of the gate insulation layer 33 and the substrate 1. A lower portion of each of the active patterns AR may define an "anchor"-shape in cross section. That is, respective undercut regions U may be formed in the buried insulation layer 3, and the second sub active patterns 37a may extend along and/or cover inner surfaces of the respective undercut regions U. Further, the second sub active patterns 37a may extend along and/or cover respective inner sidewalls of the first sub active patterns 35a. Moreover, the second sub active patterns 37a may extend to partially or completely fill spaces between lower portions of the first sub active patterns 35a and the semiconductor layer 5. A topmost width W1 of the undercut regions U in the buried insulation layer 3 including the second sub active pattern 37a therein may be greater than a width W2 of the semiconductor layer 5 including the second sub active pattern 37a therein. Each of the active patterns AR may be an undoped polysilicon layer or a doped polysilicon layer. In some embodiments, each of the active patterns AR may have an empty space or void therein and may have a "gourd"-shaped configuration. For example, each of the active patterns AR may include a lower portion having a "bowl"-shaped configuration and an upper portion having a substantially linear or "pipe"-shaped configuration. As such, a top width of the upper portion of the active pattern AR may be greater than a bottom width thereof. Timer spaces of the active patterns AR may be filled with respective ones of inner insulation patterns 39a.

A high-k dielectric layer 45 may be disposed between the conductive patterns 47l, 47w and 47u and the interlayer insulation patterns 21a, 22a, 23a, 24a, 25a, 26a, 27a and 28a, as well as between the conductive patterns 47l, 47w and 47u and the gate insulation layer 33. For example, the high-k dielectric layer 45 may be an aluminum oxide layer. An isolating insulation pattern 50 and 54 may penetrate the conductive patterns 47l, 47w and 47u and the interlayer insulation patterns 21a, 22a, 23a, 24a, 25a, 26a, 27a and 28a to contact the buffer layer 4. The isolating insulation pattern 50 and 54 may be spaced apart from the active patterns AR. The isolating insulation pattern 50 and 54 may overlap with the buried insulation layer 3 when viewed from the plan view of FIG. 2.

The isolating insulation pattern 50 and 54 may divide or split the conductive patterns 47l, 47w and 47u into a plurality of cell string blocks. The isolating insulation pattern 50 and 54 may include a first isolating insulation pattern 50 and a second isolating insulation pattern 54. The first isolating insulation pattern 50 may extend on or cover sidewalls of an isolation trench or groove 41 that penetrates the conductive patterns 47*l*, 47*w* and 47*u* and the interlayer insulation patterns 21*a*, 22*a*, 23*a*, 24*a*, 25*a*, 26*a*, 27*a* and 28*a* to expose the first impurity implantation regions 43 formed in the semiconductor layer 5. The second isolating insulation pattern 54 may substantially fill the isolation groove 41. A metal silicide layer 52*a* may be disposed between the second isolating insulation pattern 54 and the semiconductor layer 5. A conductive line may be additionally disposed between the metal silicide layer 52*a* and the second isolating insulation pattern 54. Second impurity implantation regions 56 may be disposed in respective ones of upper portions of the active patterns AR. The second impurity implantation regions 56 may be doped with impurities of the same conductivity type as the first impurity implantation region 43. The second impurity implantation regions 56 may act as drain regions of the cell strings CSTR. Conductive lines 58 may be disposed on the topmost interlayer insulation pattern 28*a* of the interlayer insulation patterns 21*a*, 22*a*, 23*a*, 24*a*, 25*a*, 26*a*, 27*a* and 28*a*. The conductive lines 58 may be electrically connected to the second impurity implantation regions 56. The conductive lines 58 may correspond to the bit lines BL0 to BL2. Contact plugs may be additionally disposed between the conductive lines 58 and the second impurity implantation regions 56.

The three-dimensional semiconductor device illustrated in FIGS. 2 and 3 may include the buffer layer 4 having an etch selectivity with respect to the substrate 1. Thus, the active patterns AR may be confined above the substrate 1, and depths of the active patterns AR extending into the buffer layer 4 may be uniform. As a result, deviation or dispersion of cell current flowing through the cell strings CSTR can be improved. Further, the common source lines 43 or CSL may be insulated from the substrate 1 by the buried insulation layer 3. Thus, leakage current characteristics of the three-dimensional semiconductor device can be improved. Therefore, highly reliable three-dimensional semiconductor devices can be realized. In addition, lower portions of the active patterns AR may be electrically connected to the substrate 1. Thus, a bulk erasure operation can be achieved by applying an appropriate bias to the substrate 1.

Now, methods of forming the three-dimensional semiconductor device illustrated in FIG. 3 will be described with reference to FIGS. 4 to 17.

Figure 4:
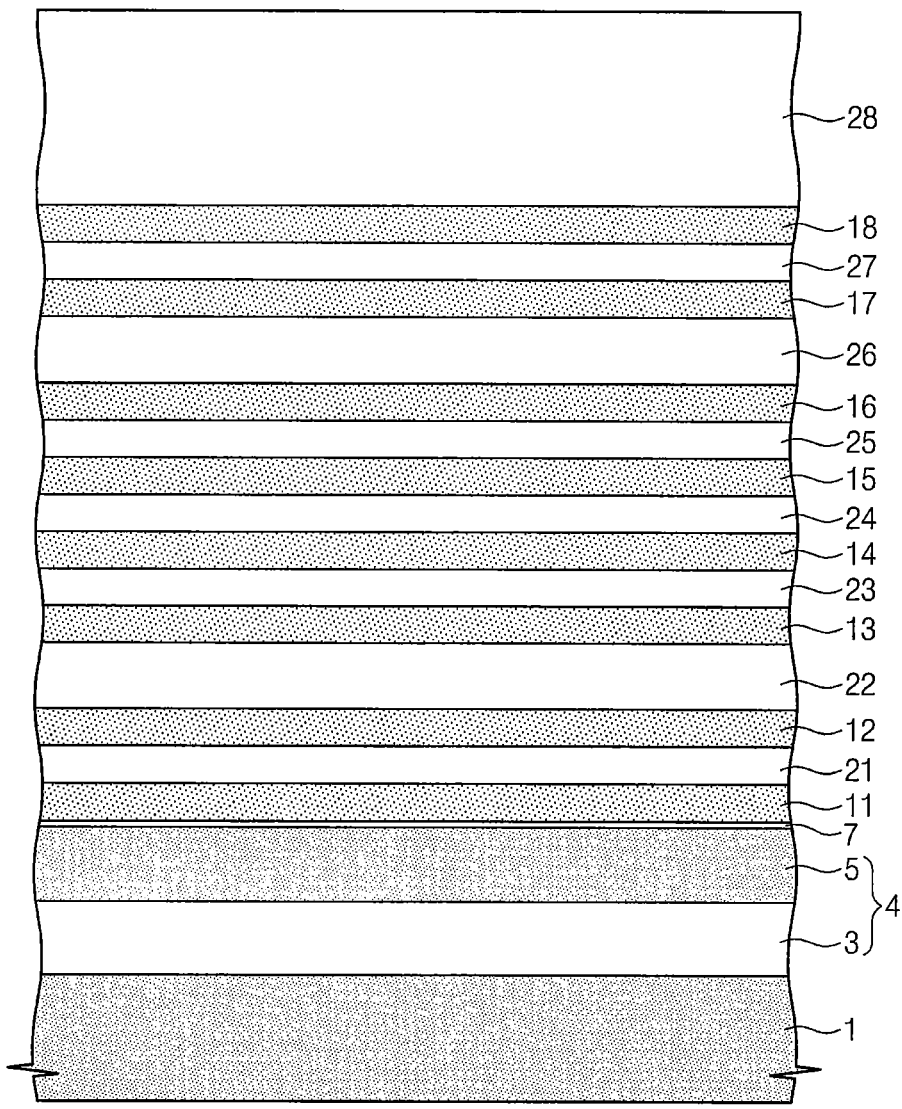
FIGS. 4 to 17 are cross sectional views illustrating methods of fabricating a three dimensional semiconductor device shown in FIG. 3.

Referring to FIG. 4, a buried insulation layer 3 and a semiconductor layer 5 may be sequentially stacked on a substrate 1. The buried insulation layer 3 and the semiconductor layer 5 may define a buffer layer 4. The buried insulation layer 3 may be formed of a silicon oxide layer. The semiconductor layer 5, for example, may be formed of a polysilicon layer or a single crystalline silicon layer. When the semiconductor layer 5 is a single crystalline silicon layer, the substrate 1, the buried insulation layer 3 and the semiconductor layer 5 may define a silicon-on-insulator (SOI) substrate. A pad oxide layer 7 may be formed on the semiconductor layer 5. Sacrificial layers 11, 12, 13, 14, 15, 16, 17 and 18 and interlayer insulation layers 21, 22, 23, 24, 25, 26, 27 and 28 may be alternately and repeatedly stacked on the pad oxide layer 7. The sacrificial layers may include first to eighth sacrificial layers 11, 12, 13, 14, 15, 16, 17 and 18 stacked in order from a lower level toward an upper level. Similarly, the interlayer insulation layers may include first to eighth interlayer insulation layers 21, 22, 23, 24, 25, 26, 27 and 28 stacked in order from a lower level toward an upper level. The sacrificial layers 11, 12, 13, 14, 15, 16, 17 and 18 may be formed of a material having an etch selectivity with respect to the interlayer insulation layers 21, 22, 23, 24, 25, 26, 27 and 28. For example, the interlayer insulation layers 21, 22, 23, 24, 25, 26, 27 and 28 may be formed of a layer of silicon oxide system, and sacrificial layers 11, 12, 13, 14, 15, 16, 17 and 18 may be formed of a layer of silicon nitride system or a layer of silicon germanium system.

Figure 5:
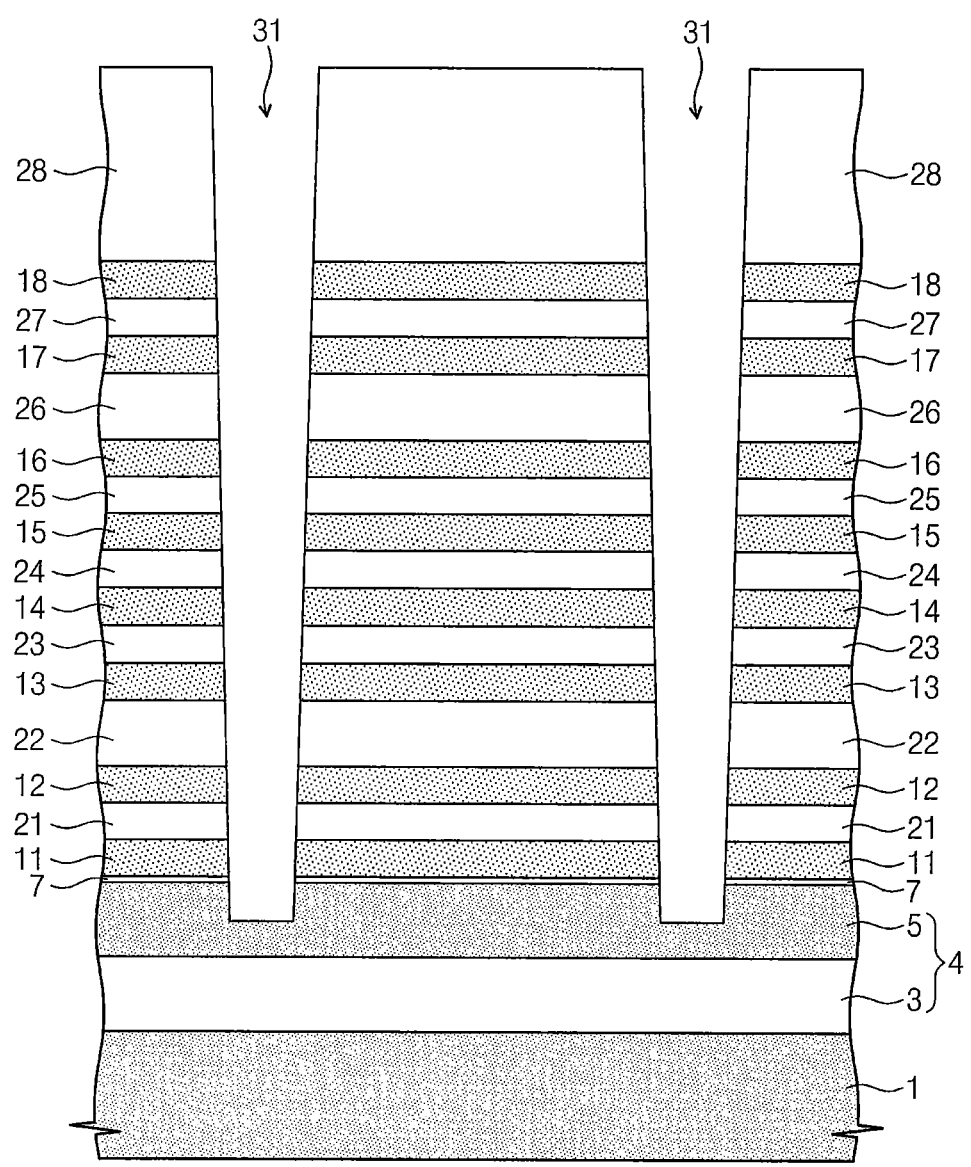

Referring to FIG. 5, the interlayer insulation layers 21, 22, 23, 24, 25, 26, 27 and 28, the sacrificial layers 11, 12, 13, 14, 15, 16, 17 and 18, and the pad oxide layer 7 may be patterned using a first anisotropic etching process to form a plurality of openings (also referred to herein as "active holes") 31 that expose portions of the semiconductor layer 5. The first anisotropic etching process may provide a substantially similar etch rate with respect to the interlayer insulation layers 21, 22, 23, 24, 25, 26, 27 and 28, the sacrificial layers 11, 12, 13, 14, 15, 16, 17 and 18, and the pad oxide layer 7. That is, during the first anisotropic etching process to form the active holes 31, the interlayer insulation layers 21, 22, 23, 24, 25, 26, 27 and 28, the sacrificial layers 11, 12, 13, 14, 15, 16, 17 and 18, and the pad oxide layer 7 may not have an etch selectivity with each other. The semiconductor layer 5 may be partially etched due to an over-etch step of the first anisotropic etching process, such that depths of the active holes 31 may be non-uniform.

Figure 6:
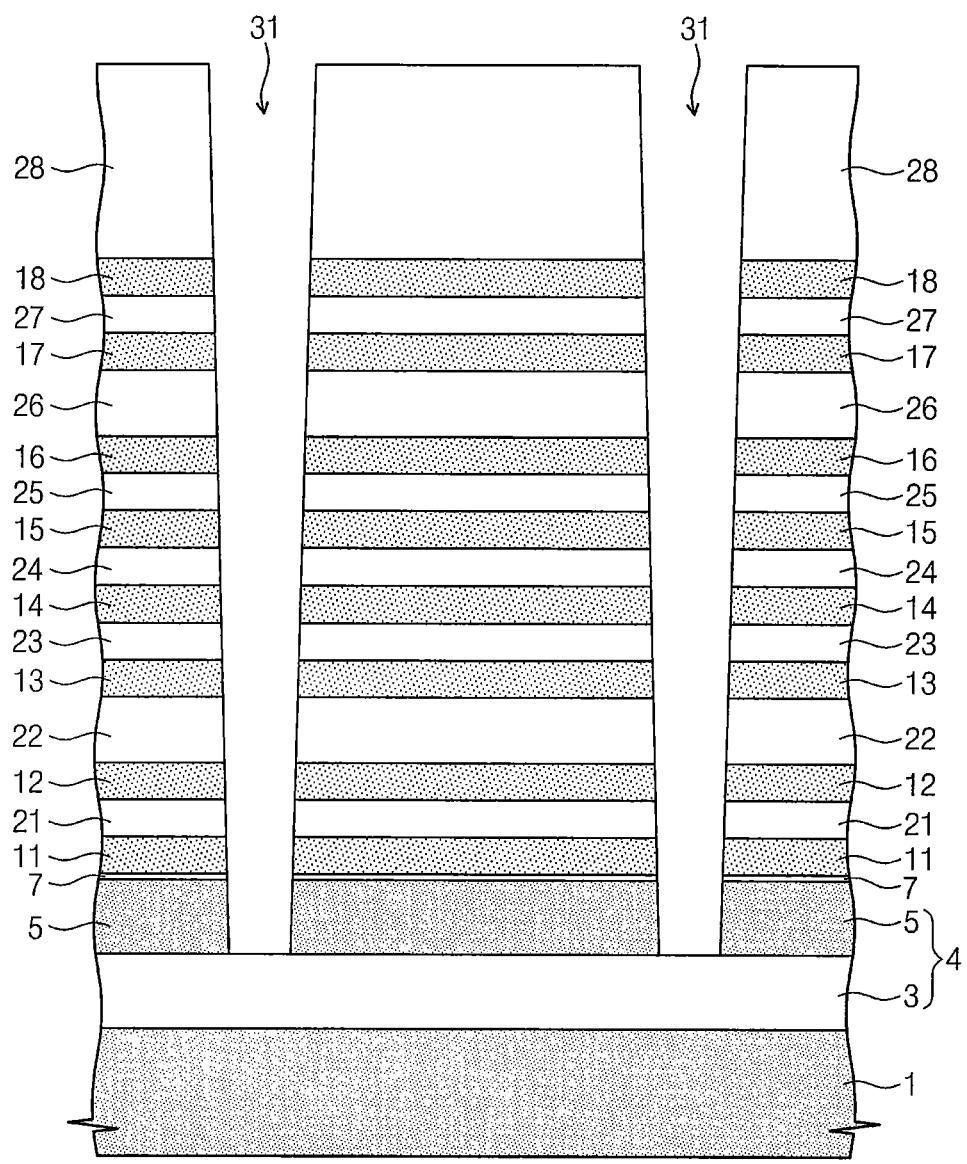

Referring to FIG. 6, the portions of the semiconductor layer 5 exposed by the active holes 31 may be removed using a second anisotropic etching process to expose portions of the buried insulation layer 3. During the second anisotropic etching process, the buried insulation layer 3 may have an etch selectivity with respect to the semiconductor layer 5. That is, the buried insulation layer 3 may act as an etch stop layer during the second anisotropic etching process. Thus, the active holes 31 exposing the buried insulation layer 3 may be formed to have uniform depths.

Figure 7:
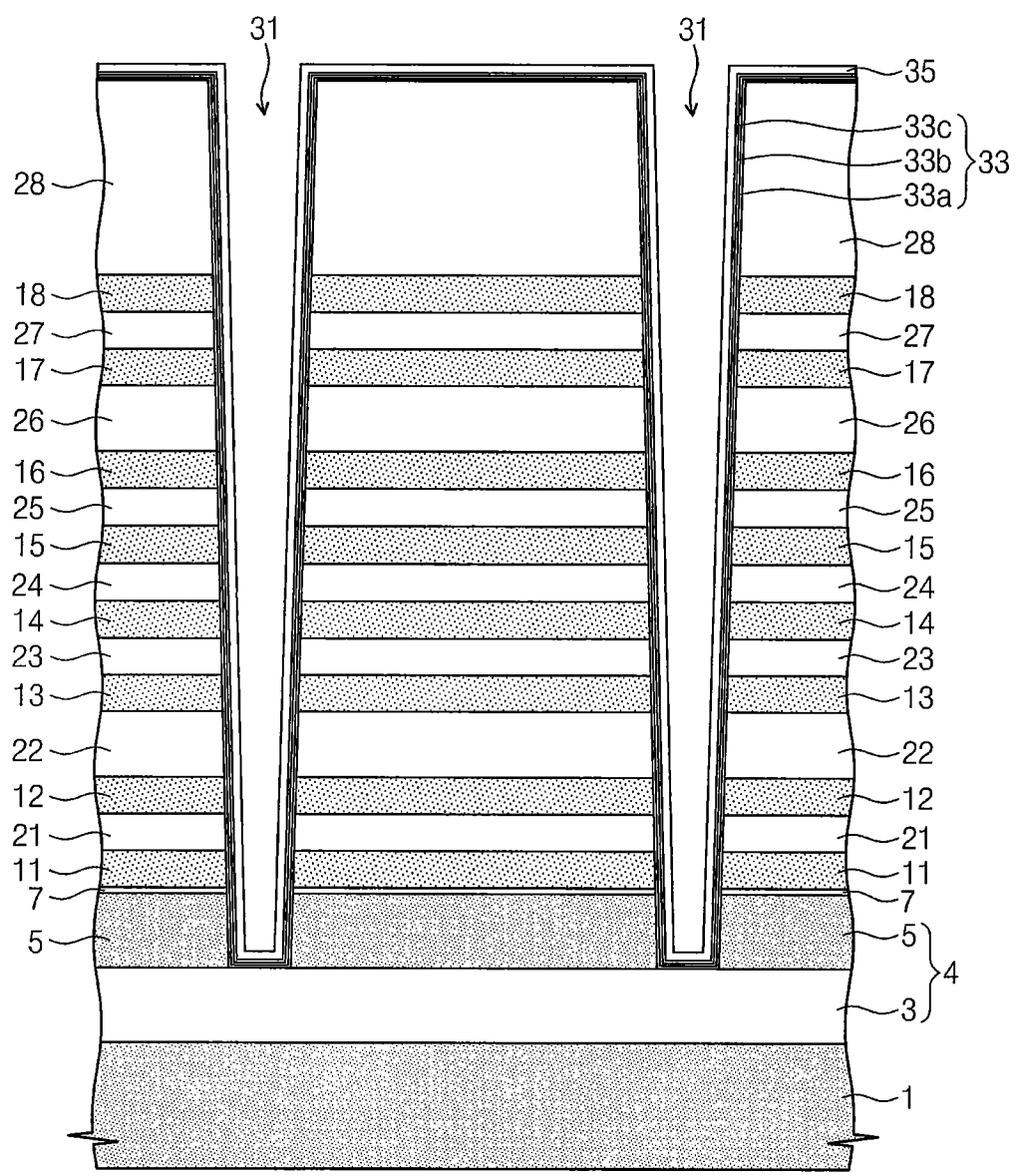

Referring to FIG. 7, a gate insulation layer 33 and a first active layer 35 may be sequentially and conformally formed along sidewalls the active holes 31 exposing the buried insulation layer 3. The first active layer 35 may be formed of a doped polysilicon layer or an undoped polysilicon layer. Since the first active layer 35 is formed to extend along or cover the gate insulation layer 33, the first active layer 35 may prevent or reduce the likelihood of damage to the gate insulation layer 33 in a subsequent etching process. That is, the first active layer 35 may protect the gate insulation layer 33. The gate insulation layer 33 may be formed by sequentially stacking a blocking insulation layer 33*a*, a charge trapping layer 33*b* and a tunnel insulation layer 33*c*. The tunnel insulation layer 33*c* may be formed of a material having a greater band gap energy than the charge trapping layer 33*b*. The tunnel insulation layer 33*c* may be formed using a chemical vapor deposition (CVD) process or an atomic layer deposition (ALD) process. For example, the tunnel insulation layer 33*c* may be formed of a silicon oxide layer using one of a chemical vapor deposition (CVD) process and an atomic layer deposition (ALD) process. Further, the tunnel insulation layer 33*c* may be formed in a predetermined annealing step which is performed after deposition thereof. The predetermined annealing step may correspond to a rapid thermal nitrification (RTN) process or an annealing process performed in an ambient gas including at least one of a nitrogen gas and an oxygen gas. The charge trapping layer 33*b* may be formed of a silicon nitride layer, a silicon oxynitride layer, a silicon-rich nitride layer, a nano-crystalline silicon layer, and/or a laminated trap layer. The blocking insulation layer 33*a* may be formed of a silicon oxide layer and/or a high-k dielectric layer.

Figure 8:
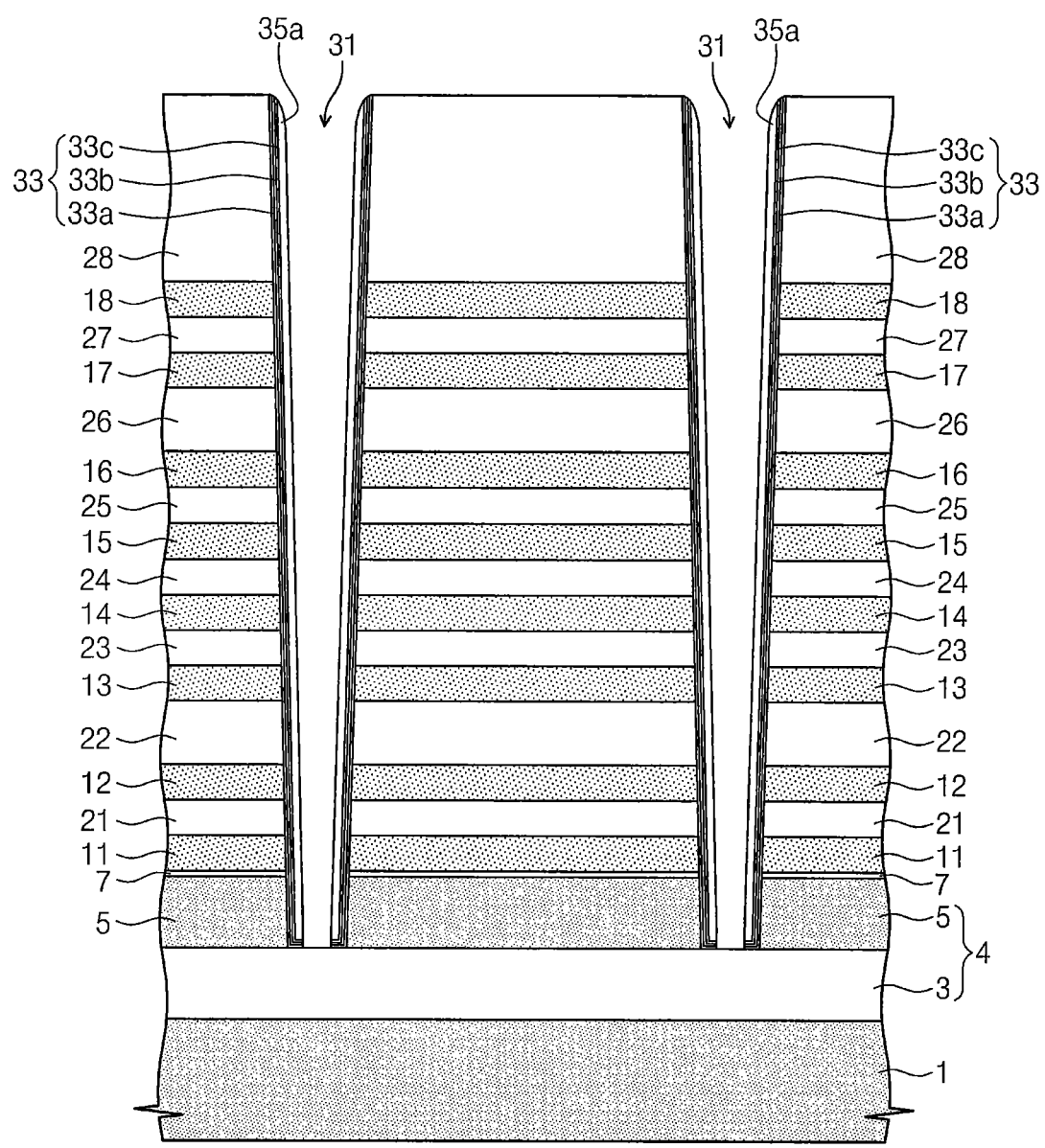

Referring to FIG. 8, the first active layer 35 and the gate insulation layer 33 outside the openings 31 may be anisotropically etched to expose a top surface of the topmost interlayer insulation layer (e.g., the eighth interlayer insulation layer 28) as well as portions of the buried insulation layer 3 under the active holes 31 to simultaneously define a first sub active pattern 35a and the gate insulation layer 33 covering an inner sidewall of each of the active holes 31. In each of the active holes 31, the gate insulation layer 33 may be formed to have an "L"-shaped cross section.

Figure 9:
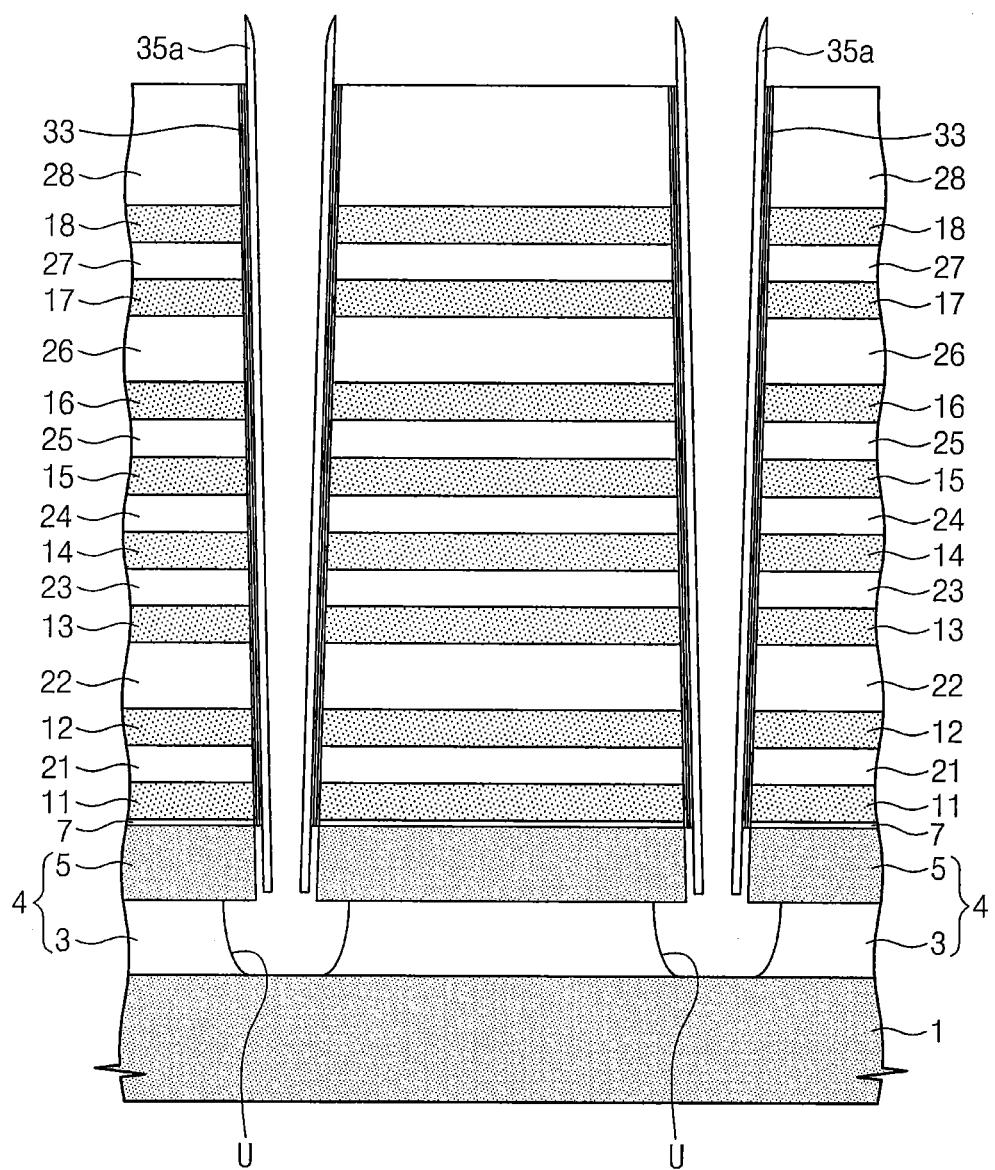

Referring to FIG. 9, lower portions of the gate insulation layers 33, which are interposed between the first sub active patterns 35a and the semiconductor layer 5, may be removed to expose bottom surfaces and lower outer sidewalls of the first sub active patterns 35a as well as sidewalls of the active holes 31 penetrating the semiconductor layer 5 and to simultaneously form undercut regions U in the buried insulation layer 3. Processes for removing the lower portions of the gate insulation layers 33 will be described in more detail hereinafter. First, lower portions of the tunnel insulation layers 33c and the blocking insulation layers 33a may be removed using a cleaning process. When the tunnel insulation layers 33c and the blocking insulation layers 33a are formed of a silicon oxide layer, the cleaning process may employ a hydrofluoric acid solution as an etchant. During removal of the lower portions of the tunnel insulation layers 33c and the blocking insulation layers 33a, portions of the buried insulation layer 3 may be removed to form the undercut regions U and an upper portion of the eighth interlayer insulation layer 28 may also be etched to become thinned. The undercut regions U may be formed to expose the semiconductor layer 5. After removing the lower portions of the tunnel insulation layers 33c and the blocking insulation layers 33a, lower portions of the charge trapping layers 33b may also be removed using another cleaning process. When the charge trapping layers 33b are formed of a silicon nitride layer, the cleaning process for removing the lower portions of the charge trapping layers 33b may be performed using a phosphoric acid solution as an etchant. The cleaning processes for removing the lower portions of the blocking insulation layers 33a, the charge trapping layers 33b and the tunnel insulation layers 33c may correspond to isotropic etching processes. Thus, the upper portions as well as the lower portions of the gate insulation layers 33 may be removed by the cleaning processes. The first sub active patterns 35a may not be removed even though the cleaning processes are performed. As a result, upper and lower outer sidewalls of the first sub active patterns 35a may be exposed after removal of the upper portions and the lower portions of the gate insulation layers 33, as illustrated in FIG. 9.

Figure 10:
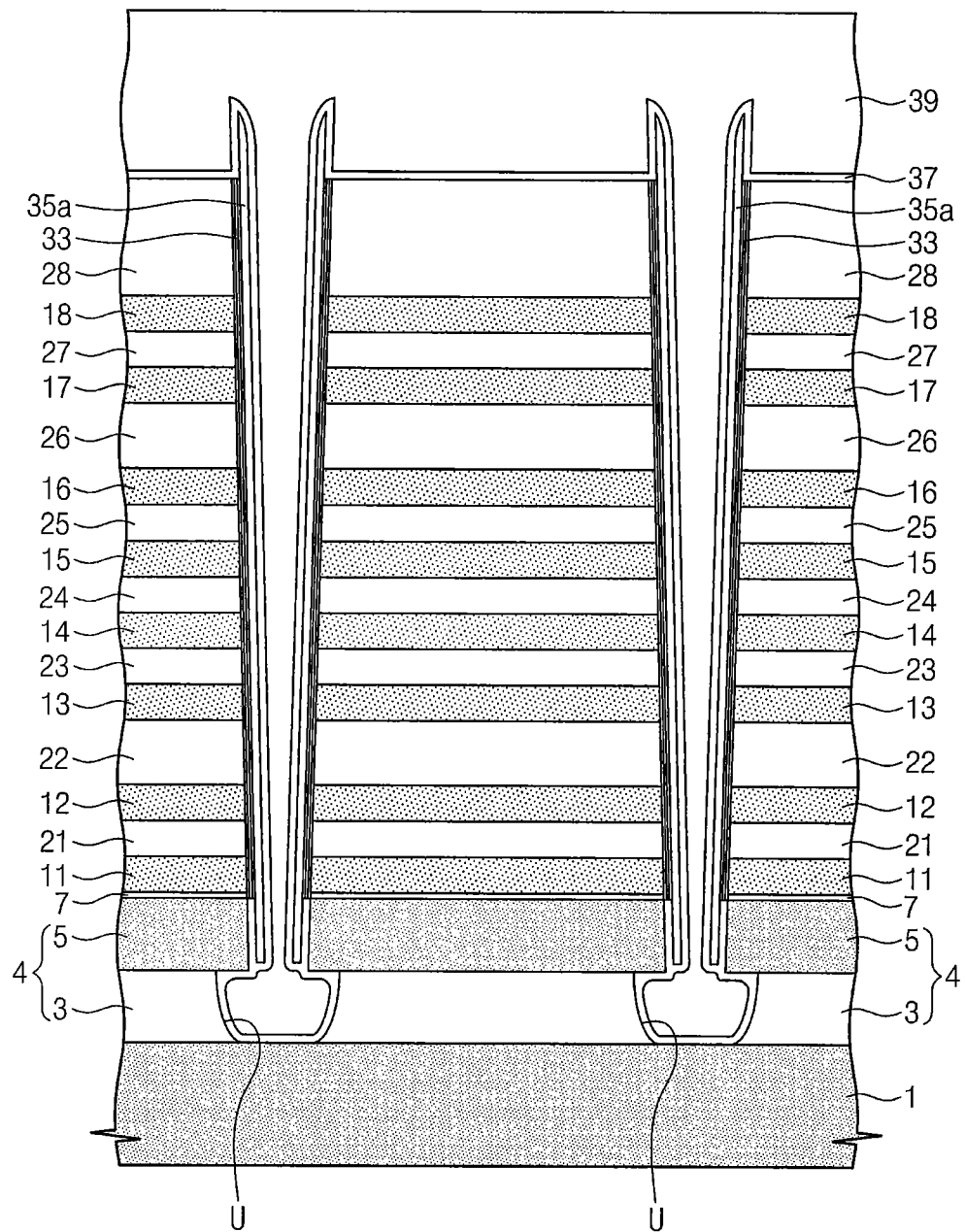

Referring to FIG. 10, a second active layer 37 may be conformally formed on the substrate including the undercut regions U. That is, the second active layer 37 may be formed to extend on or cover the inner sidewalls and the bottom surfaces of the first sub active patterns 35a as well as inner surfaces of the undercut regions U. Further, the second active layer 37 may be formed to partially or fully fill spaces between the semiconductor layer 5 and the lower portions of the first sub active patterns 35a. The second active layer 37 may be formed of a doped polysilicon layer or an undoped polysilicon layer. An inner insulation layer 39 may be formed on the second active layer 37 to substantially fill the active holes 31. The inner insulation layer 39 may also fill the undercut regions U. The inner insulation layer 39 may be formed of a material layer of silicon oxide system.

Figure 11:
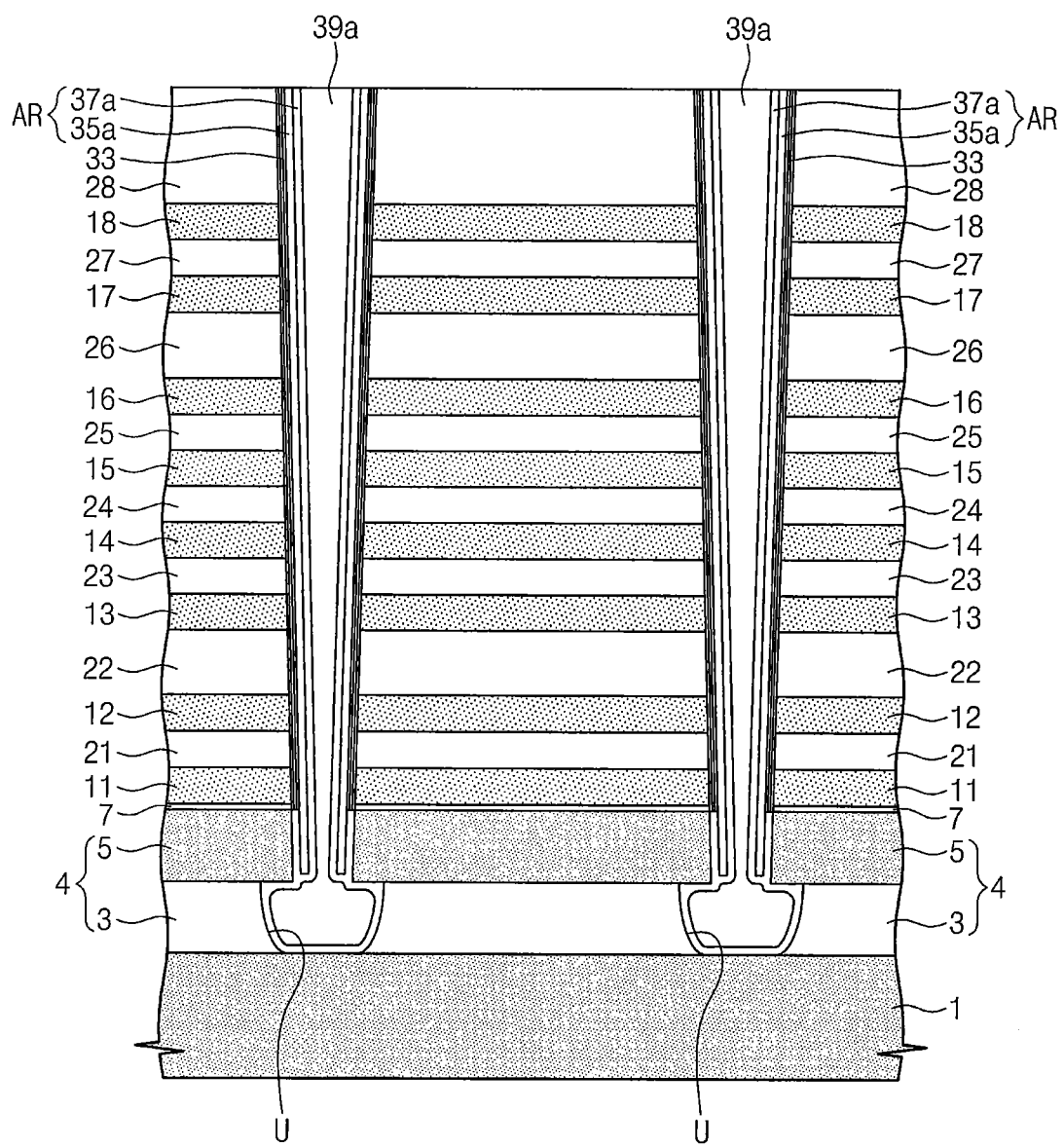

Referring to FIG. 11, the inner insulation layer 39, the second active layer 37 and the first sub active patterns 35a may be planarized to expose the top surface of the eighth interlayer insulation layer 28 and to simultaneously form second sub active patterns 37a and inner insulation patterns 39a in the active holes 31. The first sub active pattern 35a and the second sub active pattern 37a in each of the active holes 31 may define an active pattern AR.

Figure 12:
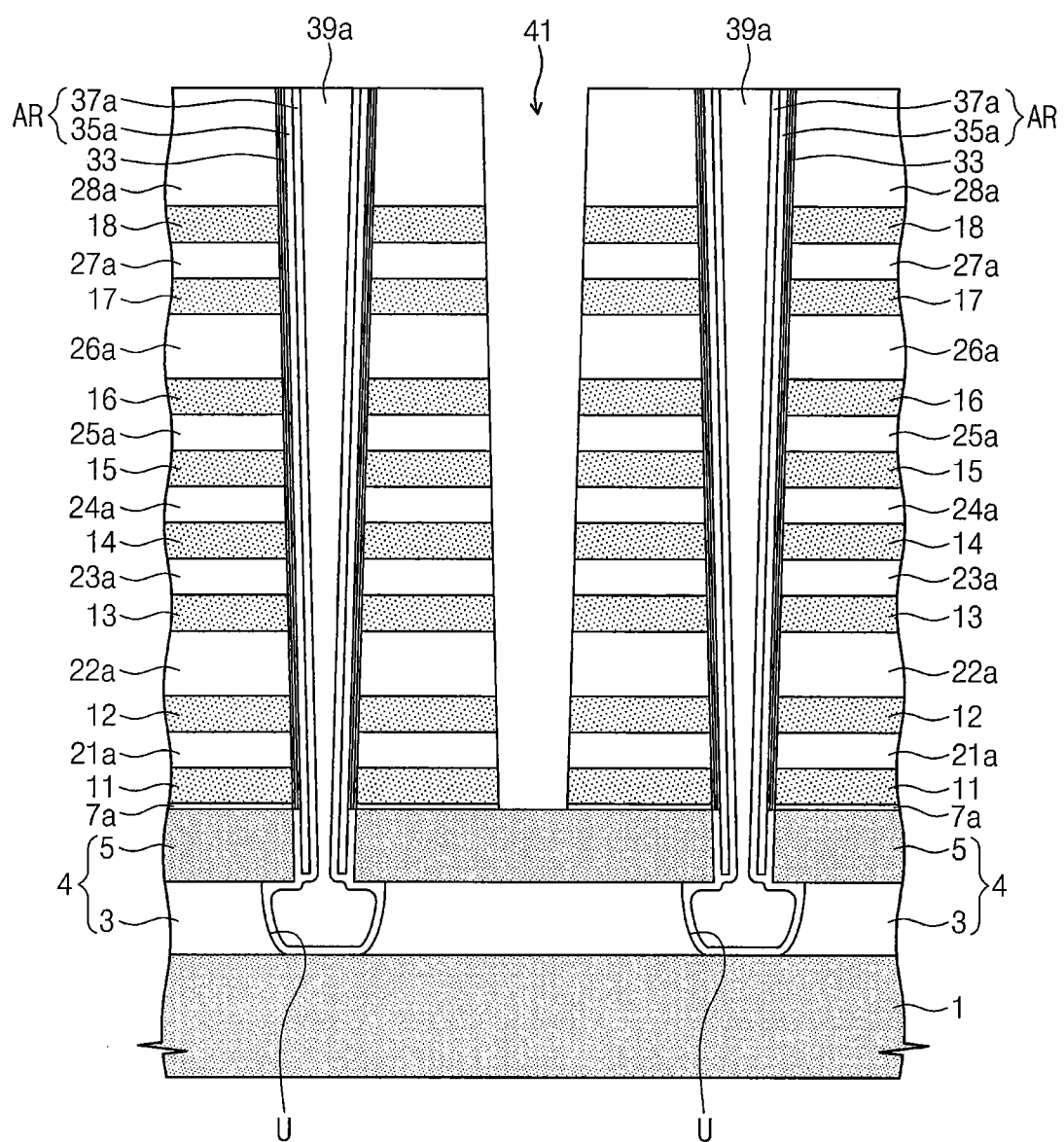

Referring to FIG. 12, the interlayer insulation layers 21 to 28, the sacrificial layers 11 to 18, and the pad oxide layer 7 may be anisotropically etched to form an isolation trench or groove 41 exposing the semiconductor layer 5 between the adjacent active patterns AR and to simultaneously form interlayer insulation patterns 21a to 28a. The isolation groove 41 may be formed to have a substantially linear shape in plan view, and may extend parallel to an x-y plane.

Figure 13:
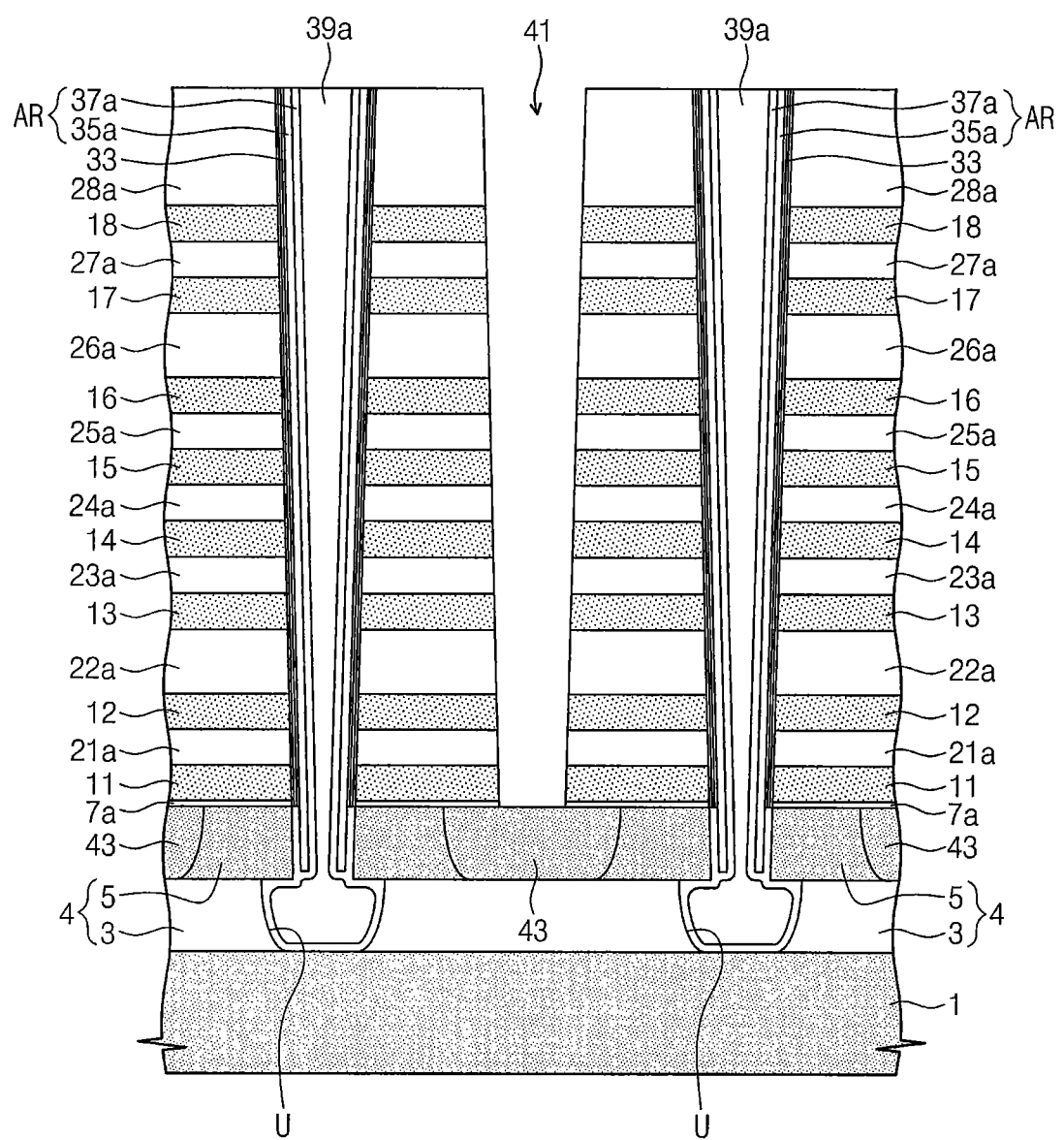

Referring to FIG. 13, impurity ions may be implanted into the semiconductor layer 5 exposed by the isolation groove 41 to form a first impurity implantation region 43. The first impurity implantation region 43 may be electrically isolated from the substrate 1 by the buried insulation layer 3.

Figure 14:
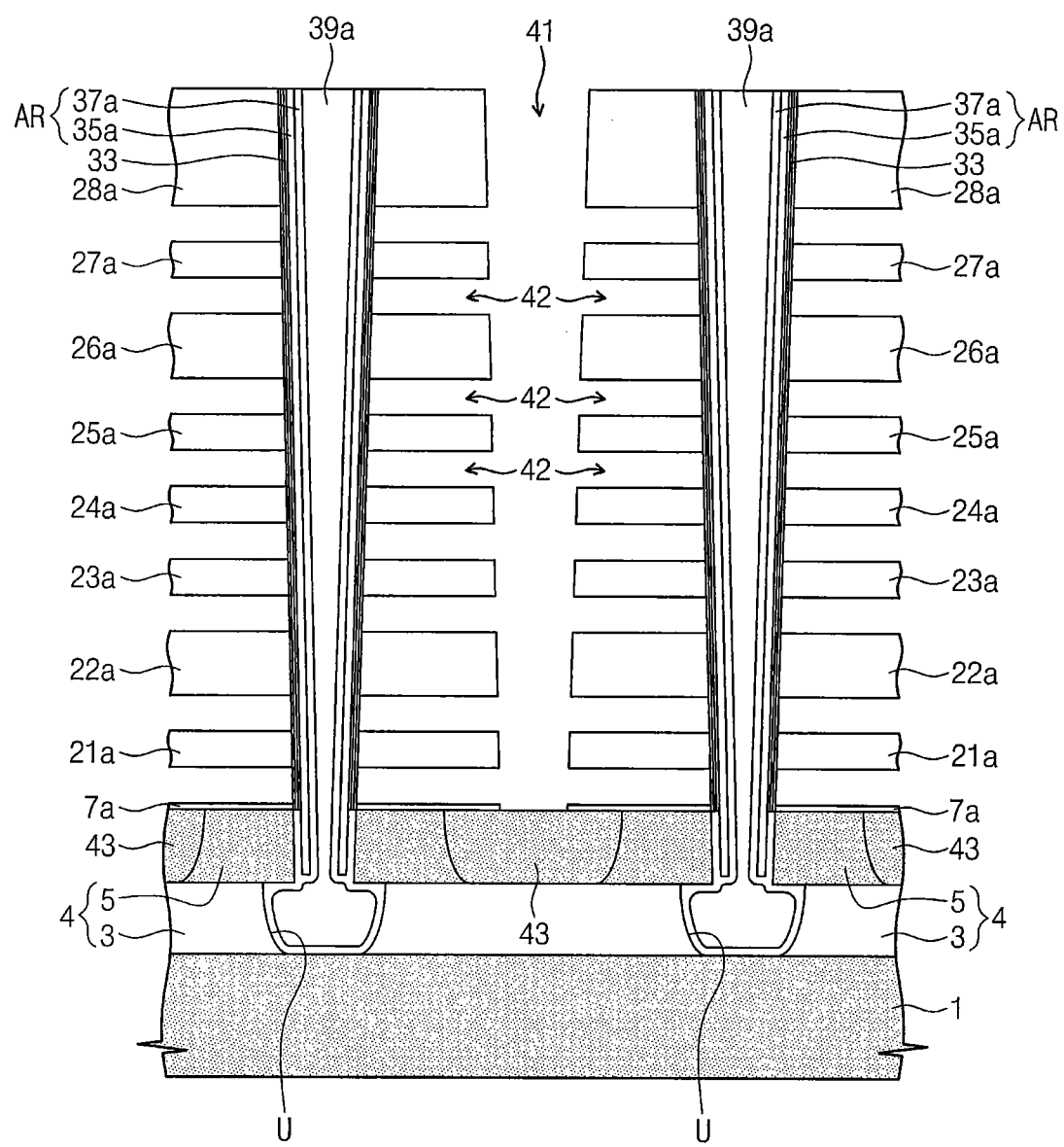

Referring to FIG. 14, the sacrificial layers 11 to 18 exposed by the isolation groove 41 may be selectively removed. The sacrificial layers 11 to 18 may be removed using an isotropic etching process. The isotropic etching process for removing the sacrificial layers 11 to 18 may be performed using an etchant exhibiting an etch selectivity of about thirty or higher with respect to the interlayer insulation patterns 21a to 28a. As a result, the sacrificial layers 11 to 18 may be replaced with gate formation regions 42 exposing sidewalls of the gate insulation layers 33. That is, the gate formation regions 42 may be defined between the interlayer insulation patterns 21a to 28a that are vertically stacked. The gate formation regions 42 may also expose top and bottom surfaces of the interlayer insulation patterns 21a to 28a.

Figure 15:
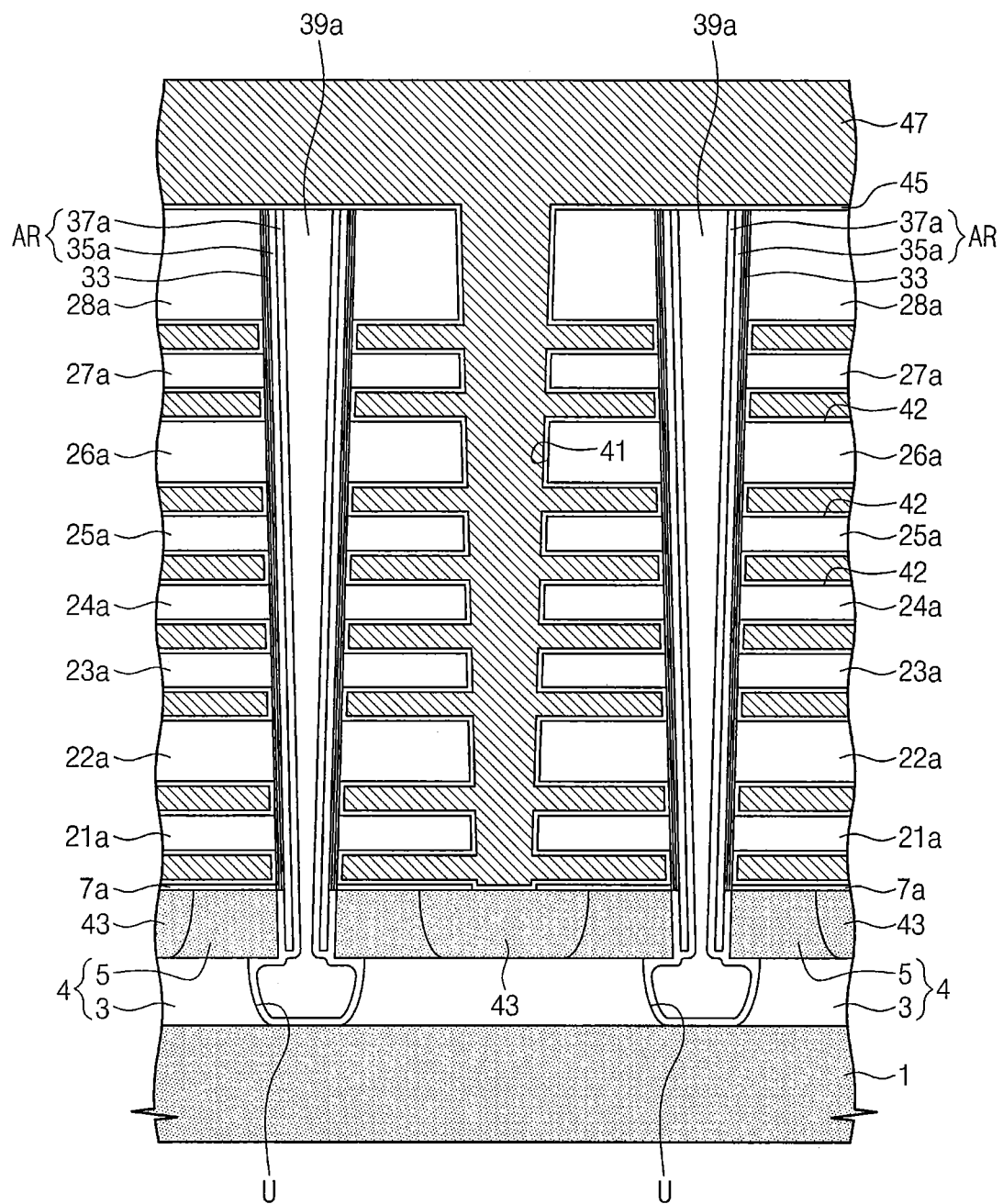

Referring to FIG. 15, a high-k dielectric layer 45 may be conformally formed on the substrate and along the gate formation regions 42. The high-k dielectric layer 45 may be formed of, for example, an aluminum oxide layer. A conductive layer 47 may be formed on the substrate to substantially fill the isolation groove 41 and the gate formation regions 42. The conductive layer 47 may be formed of a doped polysilicon layer and/or a metal containing layer.

Figure 16:
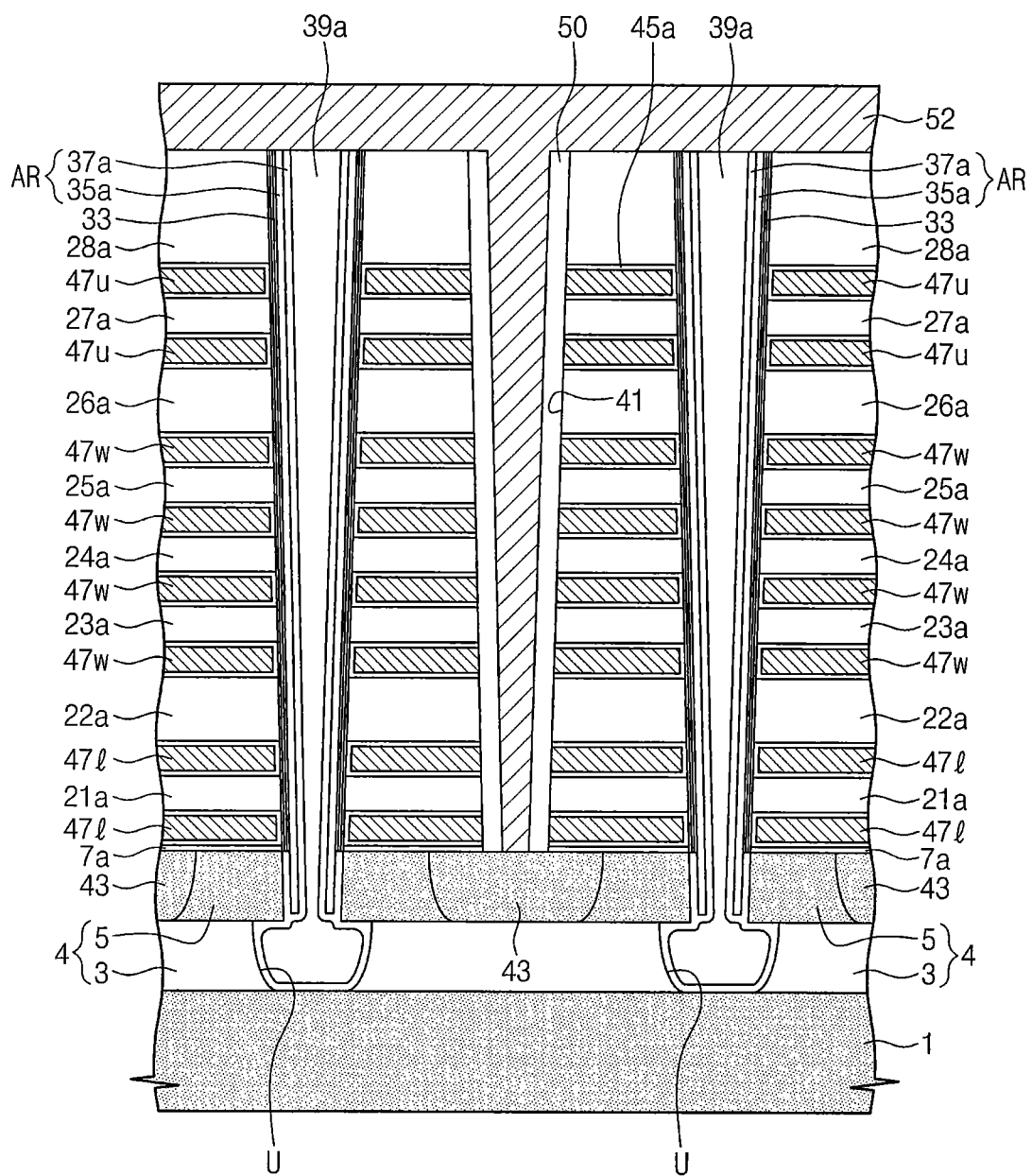

Referring to FIG. 16, the conductive layer 47 and the high-k dielectric layer 45 may be planarized to expose the top surface of the eighth interlayer insulation pattern 28a, and the conductive layer 47 inside the isolation groove 41 may be removed to form conductive patterns 47l, 47w and 47u remaining in the gate formation regions 42. A first isolating insulation pattern 50 may be formed to extend on or cover the sidewalls of the isolation groove 41 and to expose the first impurity implantation region 43. A metal layer 52 may be formed on the substrate including the first isolating insulation pattern 50. The metal layer 52 may be formed to fill the isolation groove 41.

Figure 17:
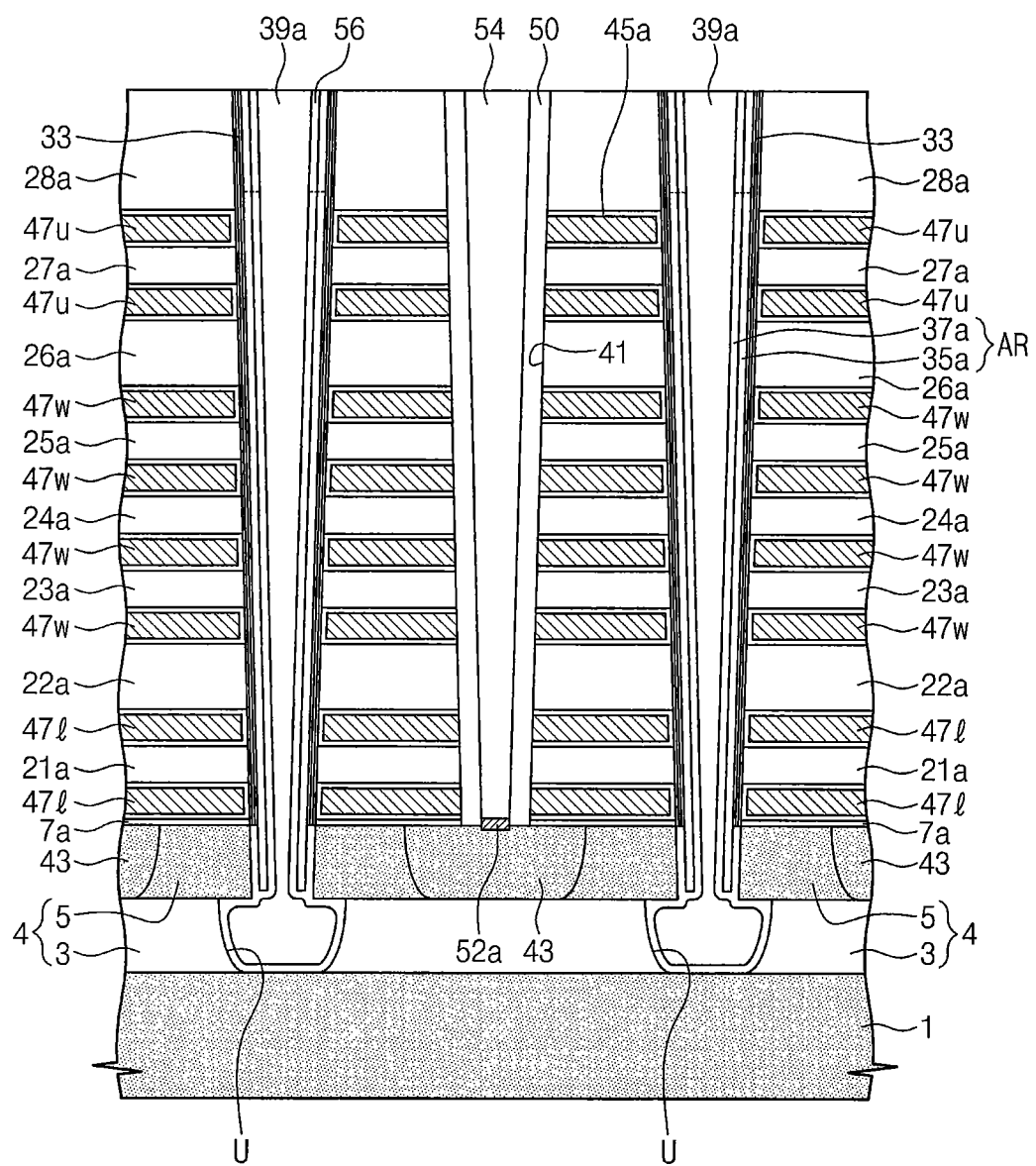

Referring to FIG. 17, an annealing process may be performed to react the metal layer 52 with the semiconductor layer 5 (e.g., the first impurity implantation region 43), thereby forming a metal silicide layer 52a between the metal layer 52 and the semiconductor layer 5. The unreacted metal layer 52 may be partially or fully removed. That is, the unreacted metal layer 52 may be completely removed or a portion of the unreacted metal layer 52 may remain in a lower portion of the isolation groove 41. A second isolating insulation pattern 54 may be then formed to fill the isolation groove 41. In some embodiments, the processes for forming the metal silicide layer 52a may be omitted.

Referring again to FIGS. 3 and 17, second impurity implantation regions 56 may be formed in the upper portions of the active patterns AR using an ion implantation process. A conductive layer may be formed on the substrate including the second impurity implantation regions 56, and the conductive layer may be patterned to form conductive lines 58 that contact the second impurity implantation regions 56 and extend in a first direction (e.g., an x-axis direction of FIG. 3). Subsequent processes for forming interconnection lines may then be performed. The interconnection lines may be formed to apply electrical signals to the conductive patterns 47l, 47w and 47u. The word line conductive patterns 47w disposed in the same plane parallel with an x-y plane may be electrically connected to each other.

Figure 18:
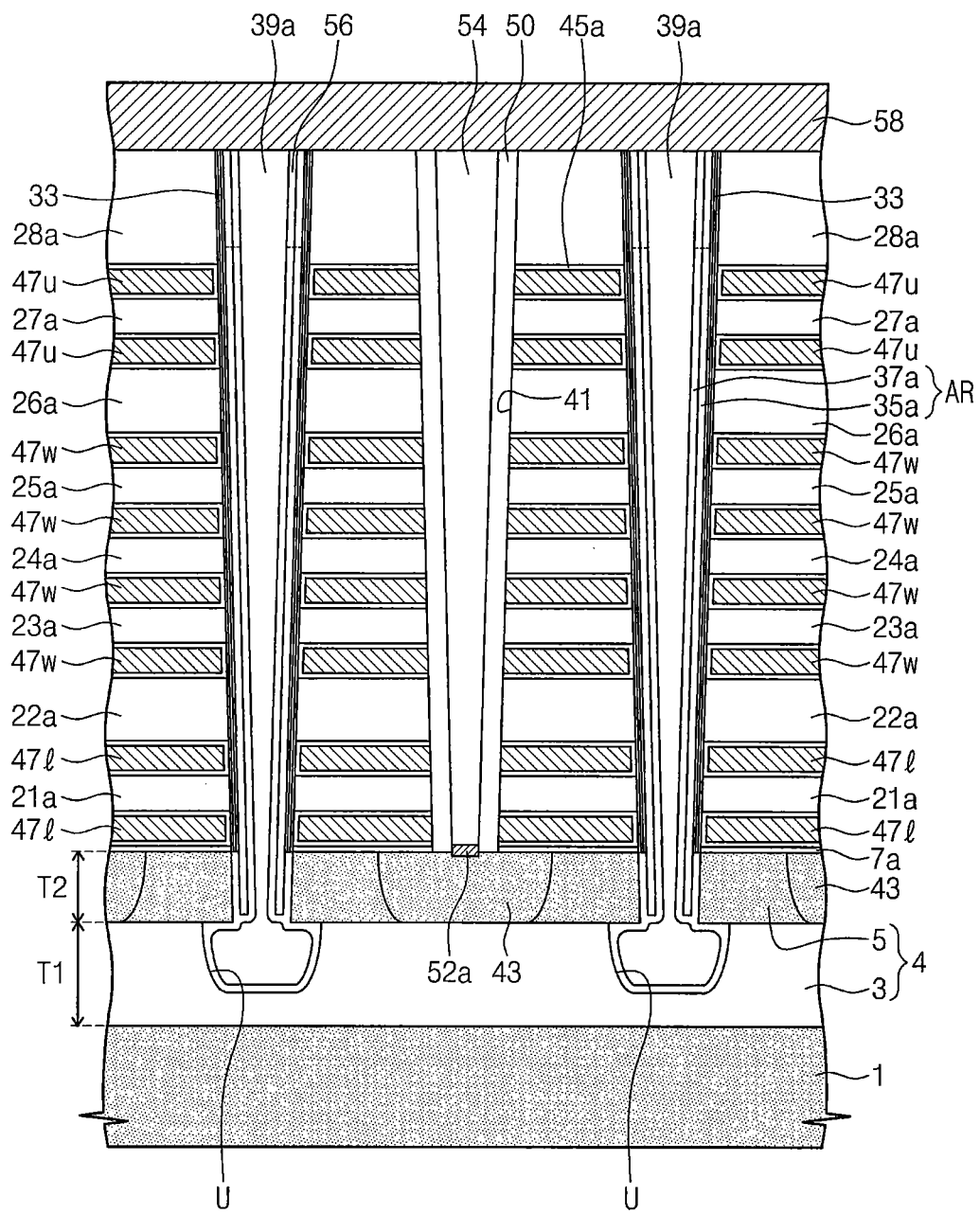
FIG. 18 is a cross sectional view taken along a line I-I' of FIG. 2 to illustrate a three dimensional semiconductor device according to further embodiments described herein.

FIG. 18 is a cross sectional view taken along a line I-I' of FIG. 2 to illustrate a three dimensional semiconductor device according to further embodiments.

Referring to FIG. 18, a thickness T1 of the buried insulation layer 3 of the buffer layer 4 may be greater than a thickness T2 of the semiconductor layer 5. In this case, bottom surfaces of the active patterns AR may not be in contact with the substrate 1, and the buried insulation layer 3 may be disposed between the substrate 1 and the bottom surfaces of the active patterns AR. That is, the active patterns AR may not be directly connected to the substrate 1. Although not shown in the figures, the active patterns AR may be electrically connected to the substrate 1 through additional contact plugs or additional semiconductor patterns. The present embodiment may have the same configuration as or a similar configuration to the embodiments of FIGS. 1-3, except that the active patterns AR are not directly connected to the substrate 1.

Figure 19:
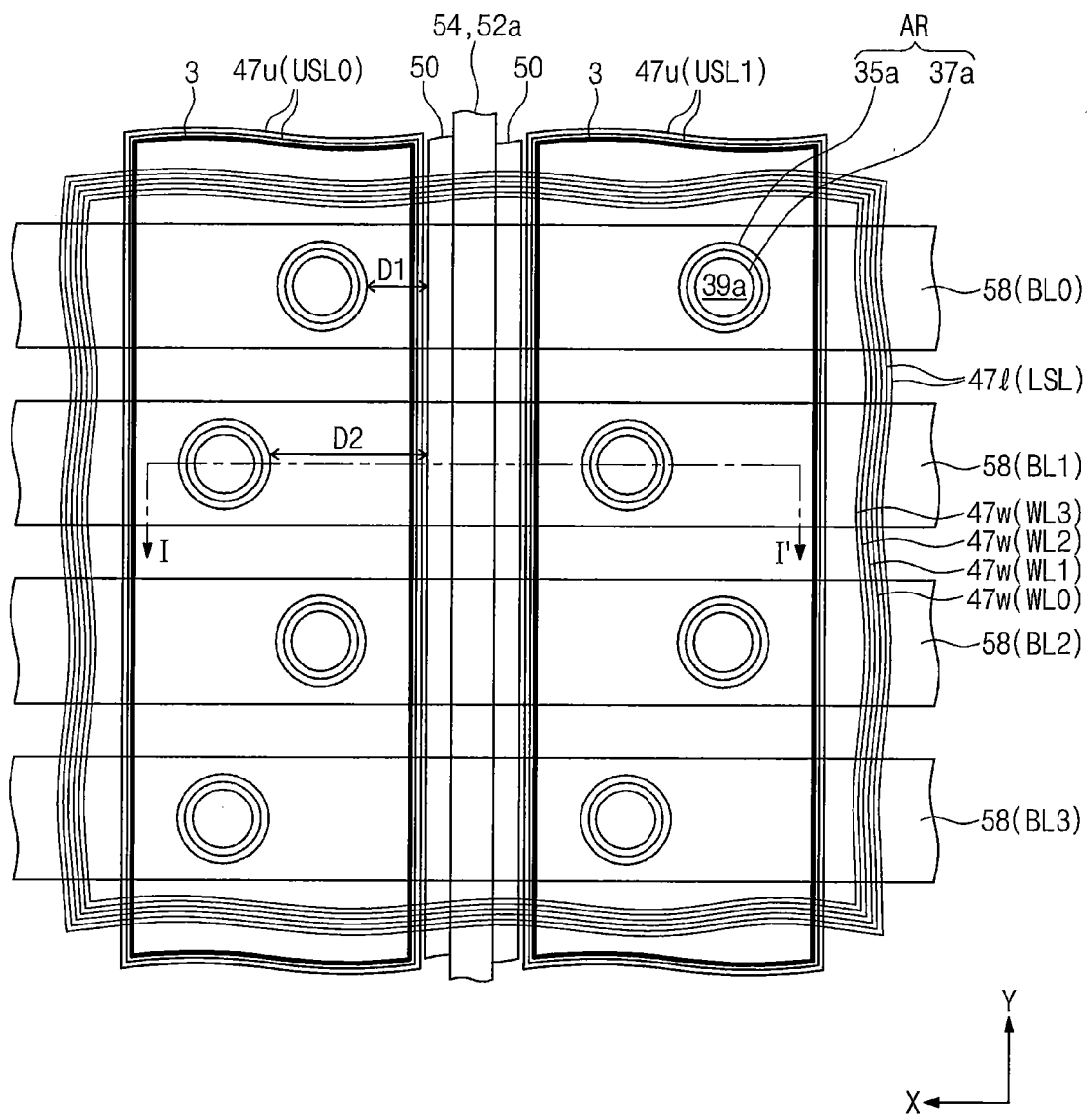
FIG. 19 is a plan view illustrating a portion of a three dimensional semiconductor device according to still further embodiments described herein.
Figure 20:
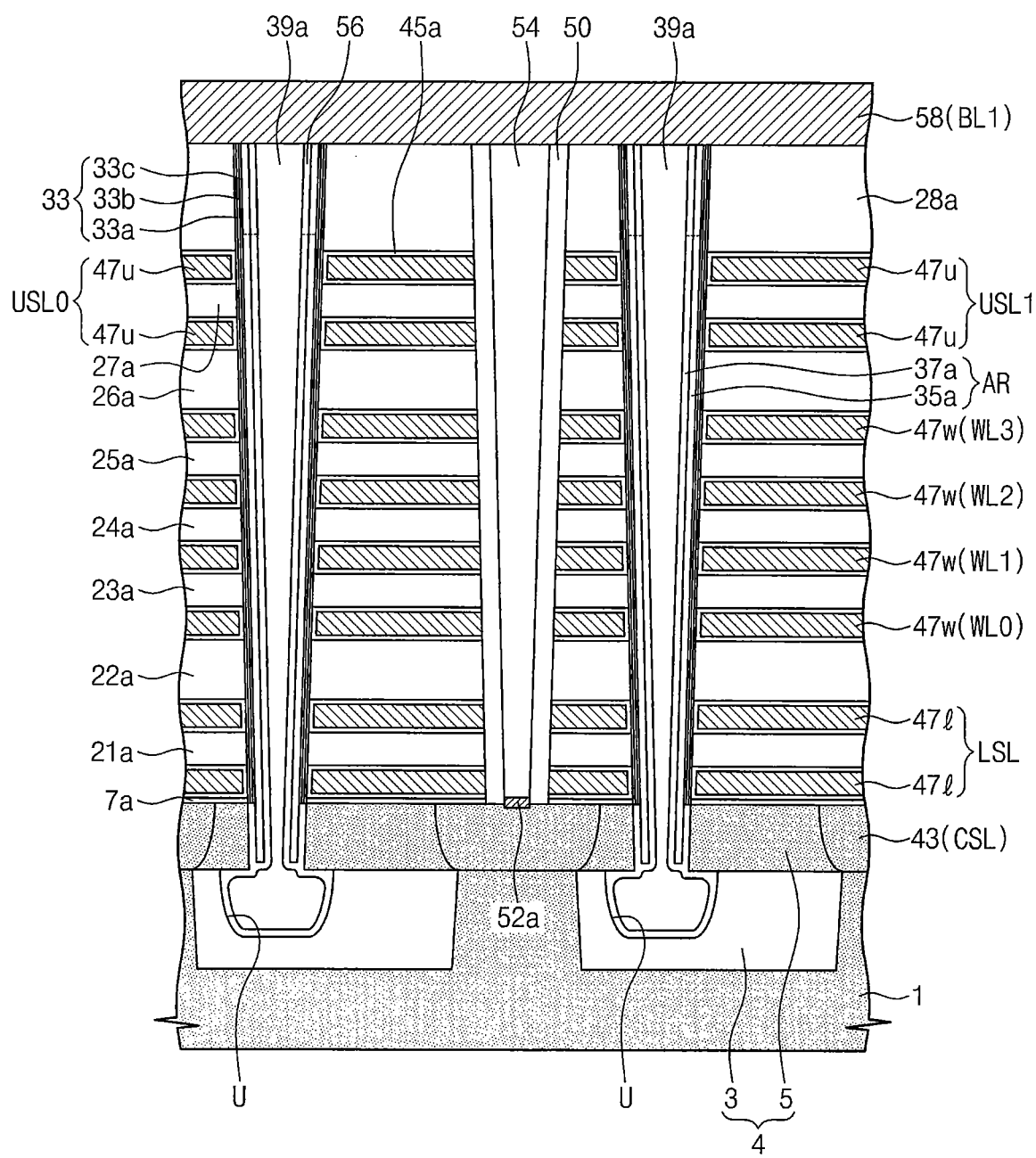
FIG. 20 is a cross sectional view taken along a line I-I' of FIG. 19.

FIG. 19 is a plan view illustrating a portion of a three dimensional semiconductor device according to still further embodiments, and FIG. 20 is a cross sectional view taken along a line I-I' of FIG. 19.

Referring to FIGS. 19 and 20, buffer layers 4 of the three dimensional semiconductor device according to the present embodiment may have a substantially linear shape and may overlap with the upper selection lines USL, when viewed in plan view. However, the buffer layers 4 may not overlap with the isolating insulation pattern 50 and 54, as illustrated in the plan view of FIG. 19. In the present embodiment, the active patterns AR penetrating each of the upper selection lines USL may be arrayed in a "zigzag" or other nonlinear manner in a second direction (e.g., along the y-axis direction). Thus, a distance D1 between the isolating insulation pattern 50 and 54 and one of the active patterns AR may be different from a distance D2 between the isolating insulation pattern 50 and 54 and another of the active patterns AR. Each of the buffer layers 4 may surround the lower portions of the active patterns AR penetrating one of the upper selection lines USL and may have a substantially linear shape extending in the second direction. The present embodiment may have the same configuration as or a similar configuration to the embodiment of FIG. 18, except for the above described configurations.

Figure 21:
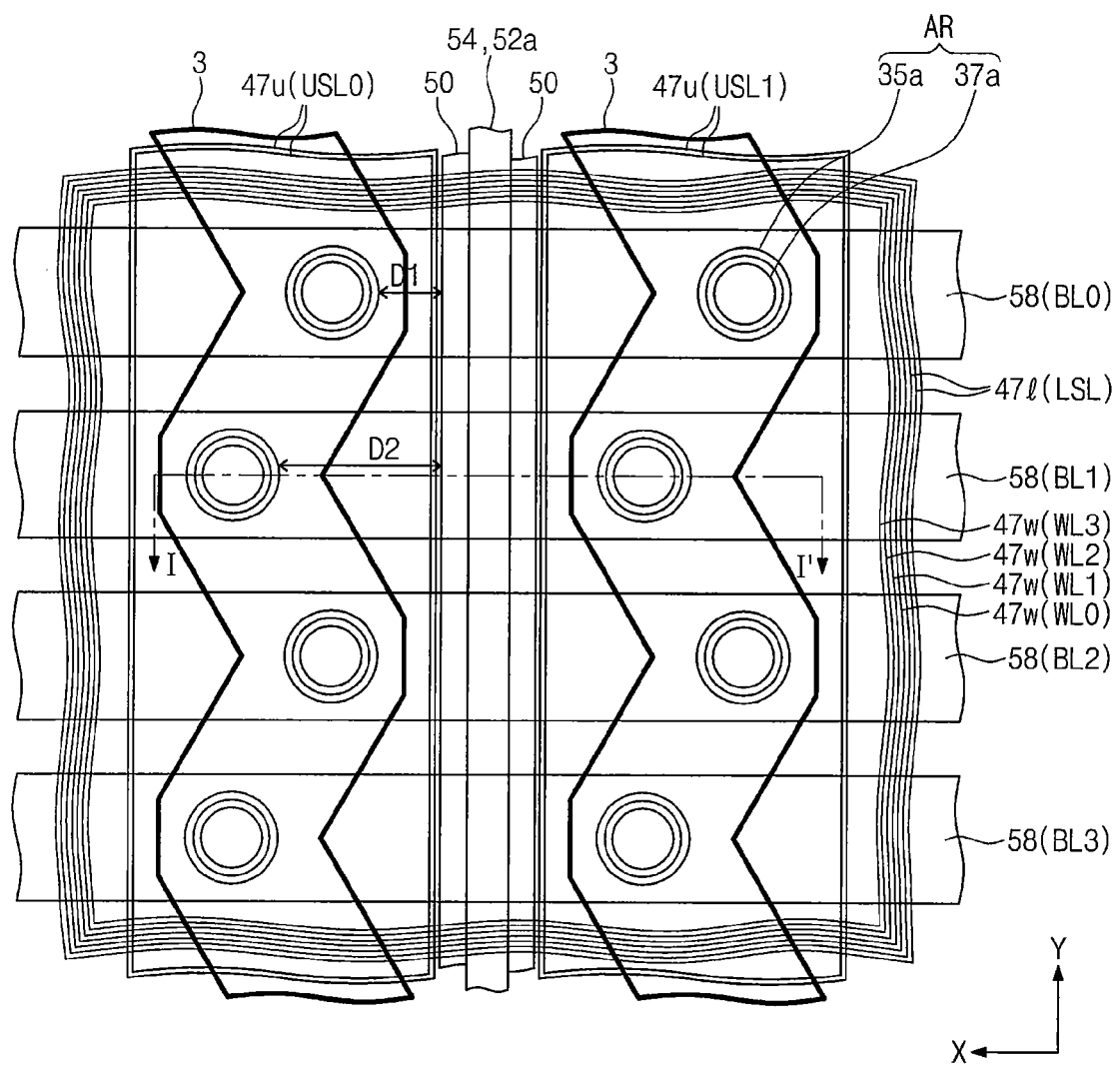
FIG. 21 is a plan view illustrating a portion of a three dimensional semiconductor device according to yet further embodiments described herein.
Figure 22:
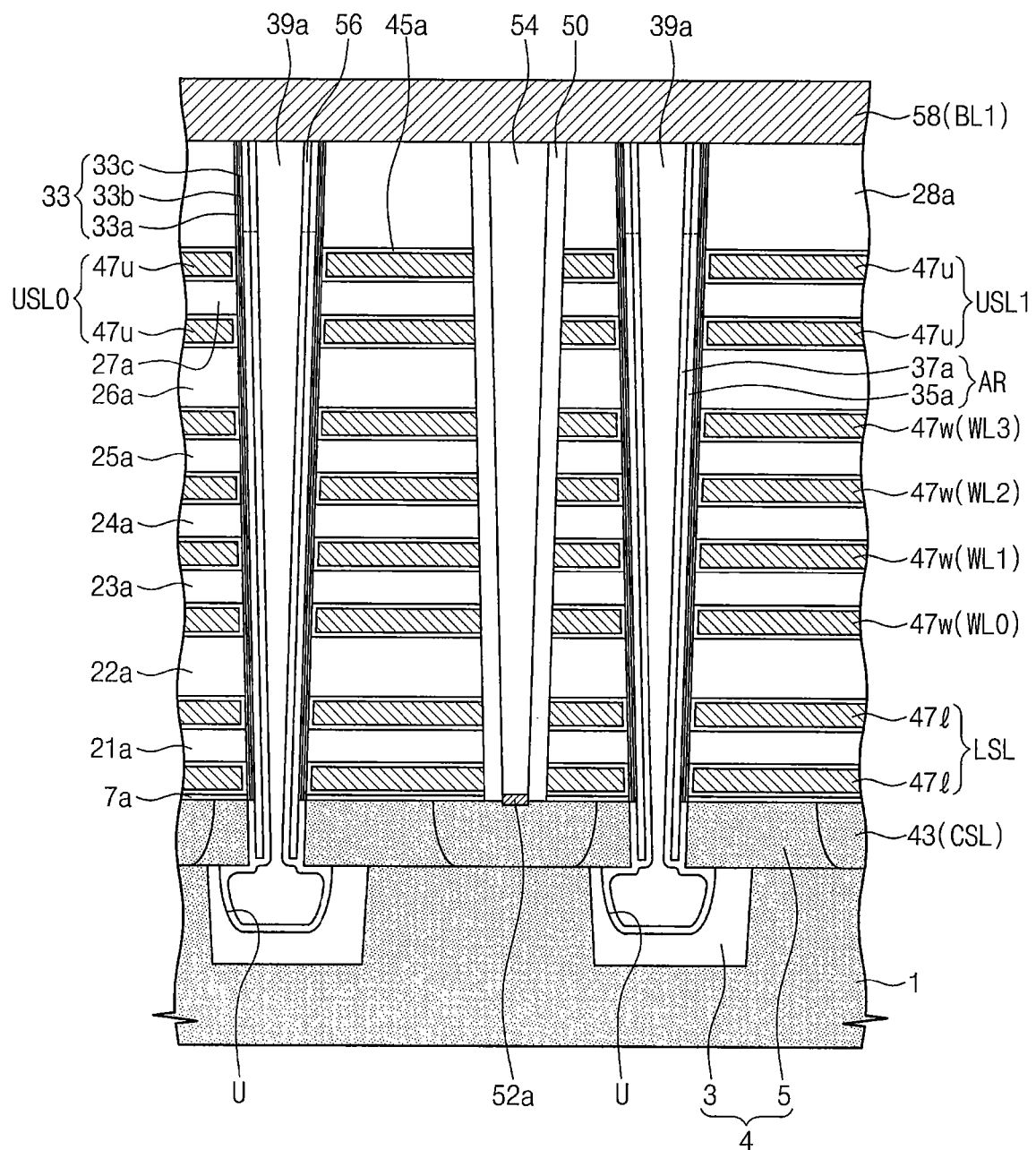
FIG. 22 is a cross sectional view taken along a line I-I' of FIG. 21.

FIG. 21 is a plan view illustrating a portion of a three dimensional semiconductor device according to yet further embodiments, and FIG. 22 is a cross sectional view taken along a line I-I' of FIG. 21.

Referring to FIGS. 21 and 22, buried insulation layers 3 of the three dimensional semiconductor device according to the present embodiment may have a zigzag or other nonlinear shape and may overlap with the upper selection lines USL, when viewed in plan view. However, the buried insulation layers 3 may not overlap with the isolating insulation pattern 50 and 54, as illustrated in the plan view of FIG. 21. In the present embodiment, the active patterns AR penetrating each of the upper selection lines USL may also be arrayed in a zigzag or other nonlinear manner in a second direction (e.g., along the y-axis direction). Thus, a distance D1 between the isolating insulation pattern 50 and 54 and one of the active patterns AR may be different from a distance D2 between the isolating insulation pattern 50 and 54 and another of the active patterns AR. Each of the buried insulation layers 3 of the buffer layers 4 may surround the lower portions of the active patterns AR penetrating one of the upper selection lines USL and may have a "zigzag" or other nonlinear shape extending in the second direction. The present embodiment may have the same configuration as or a similar configuration to the embodiment of FIGS. 19-20, except for the above described configurations.

Figure 23:
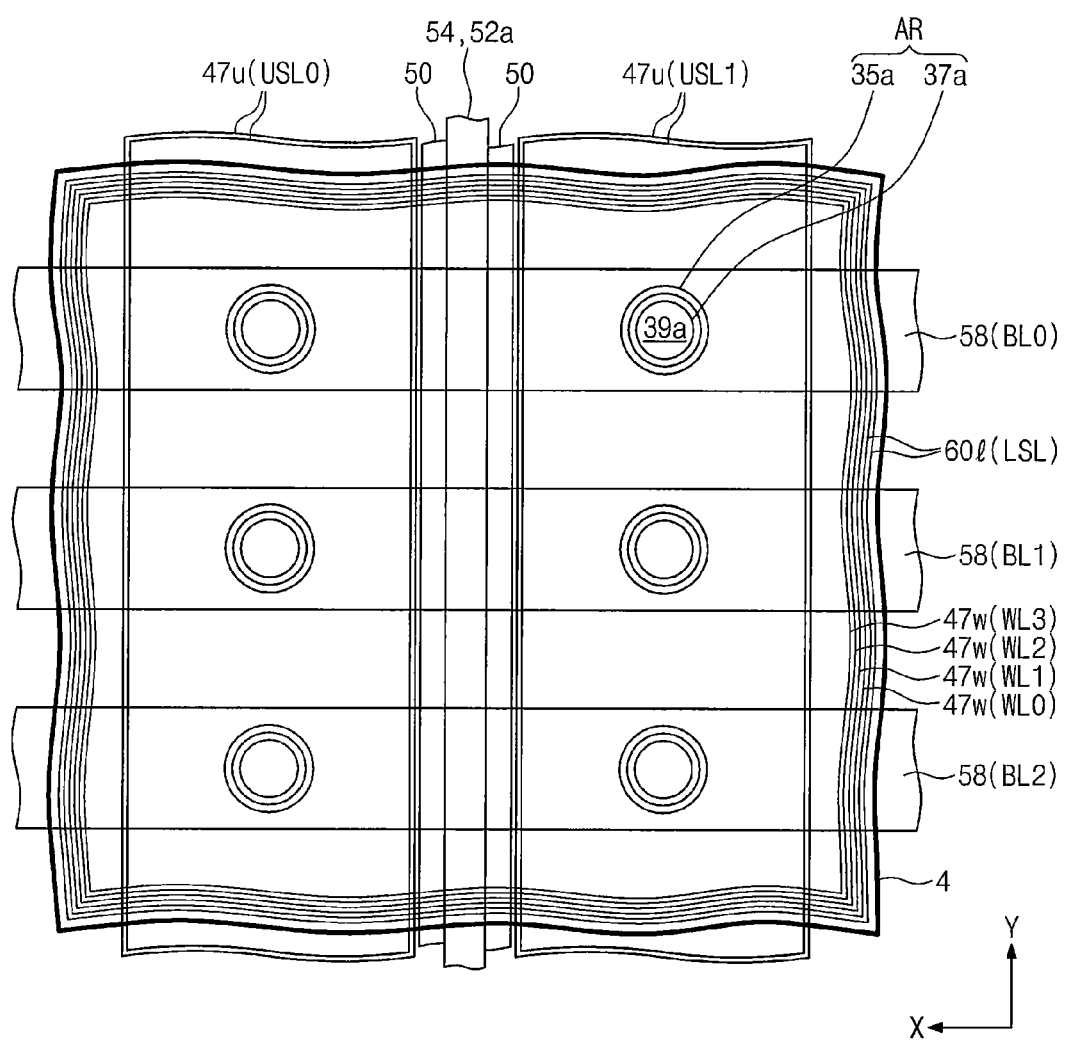
FIG. 23 a plan view illustrating a portion of a three dimensional semiconductor device according to yet still further embodiments described herein.
Figure 24:
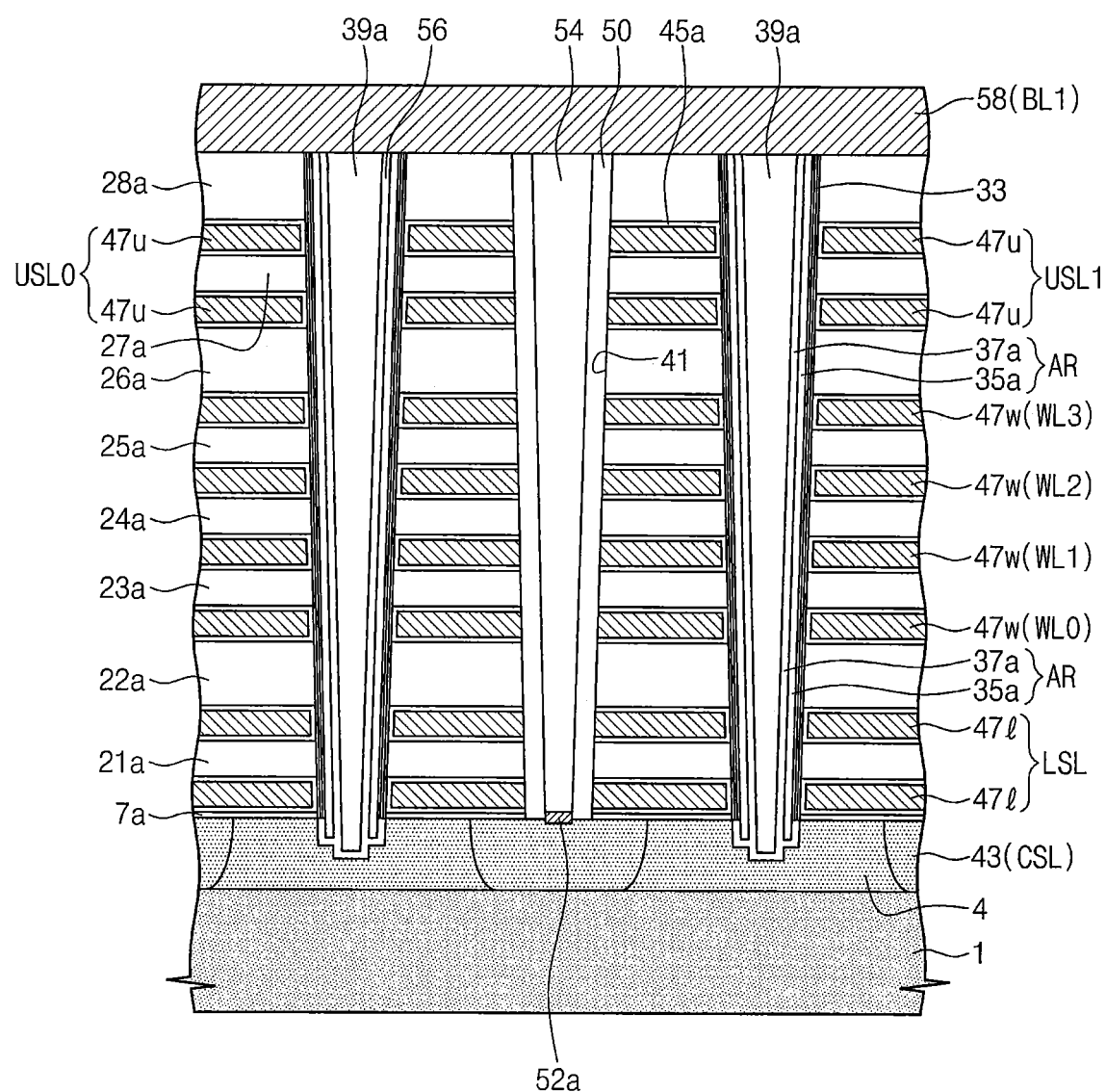
FIG. 24 is a cross sectional view taken along a line I-I' of FIG. 23.

FIG. 23 is a plan view illustrating a portion of a three dimensional semiconductor device according to yet still further embodiments, and FIG. 24 is a cross sectional view taken along a line I-I' of FIG. 23.

Referring to FIGS. 23 and 24, each of buffer layers 4 of the three dimensional semiconductor device according to the present embodiment may include a polysilicon layer doped with carbon, i.e., a carbon containing polysilicon layer. The carbon containing polysilicon layer may have a lower etch rate than a single crystalline silicon layer and a polysilicon layer. In the present embodiment, the active patterns AR may not be in direct contact with the substrate 1 and, a width of lower portions of the openings 31 including the active patterns AR therein may be reduced toward the substrate 1. That is, the lower portions of the active patterns AR do not have an anchor-shaped configuration, unlike the embodiment of FIGS. 1-3. The first impurity implantation regions 43 may be disposed in the buffer layer 4. The present embodiment may have the same configuration as or a similar configuration to the embodiment of FIGS. 1-3, except for the above described configurations.

FIGS. 25 to 28 are cross sectional views illustrating methods of fabricating a three dimensional semiconductor device shown in FIG. 24.

Figure 25:
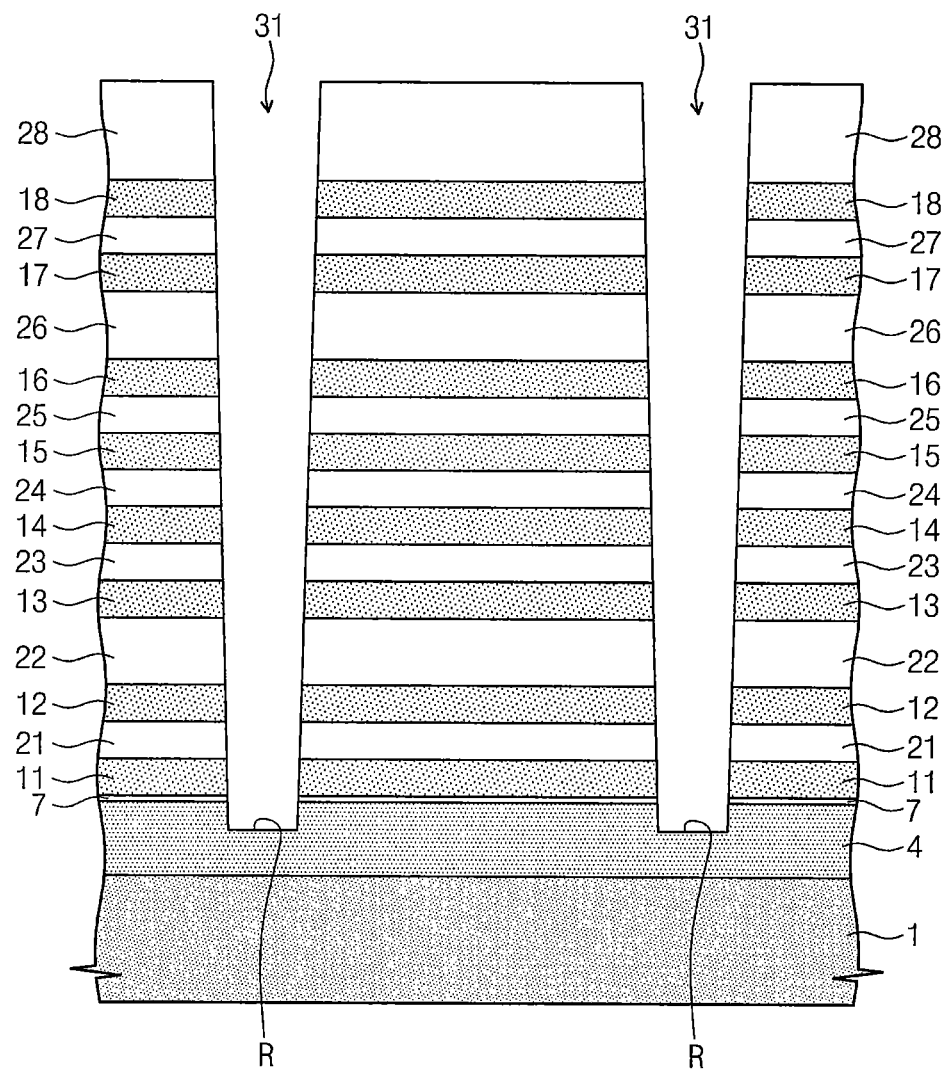
FIGS. 25 to 28 are cross sectional views illustrating methods of fabricating a three dimensional semiconductor device shown in FIG. 24.

Referring to FIG. 25, a buffer layer 4 may be formed on a substrate 1. The buffer layer 4 may be formed of a polysilicon layer doped with carbon, i.e., a carbon containing polysilicon layer. A pad oxide layer 7 may be formed on the buffer layer 4. Sacrificial layers 11, 12, 13, 14, 15, 16, 17 and 18 and interlayer insulation layers 21, 22, 23, 24, 25, 26, 27 and 28 may be alternately and repeatedly stacked on the pad oxide layer 7. The sacrificial layers may include first to eighth sacrificial layers 11, 12, 13, 14, 15, 16, 17 and 18 stacked in order from a lower level toward an upper level. Similarly, the interlayer insulation layers may include first to eighth interlayer insulation layers 21, 22, 23, 24, 25, 26, 27 and 28 stacked in order from a lower level toward an upper level. The sacrificial layers 11, 12, 13, 14, 15, 16, 17 and 18 may be formed of a material having an etch selectivity with respect to the interlayer insulation layers 21, 22, 23, 24, 25, 26, 27 and 28. For example, the interlayer insulation layers 21, 22, 23, 24, 25, 26, 27 and 28 may be formed of layers of the silicon oxide system, and sacrificial layers 11, 12, 13, 14, 15, 16, 17 and 18 may be formed of layers of the silicon nitride system or the silicon germanium system.

Referring still to FIG. 25, the interlayer insulation layers 21, 22, 23, 24, 25, 26, 27 and 28, the sacrificial layers 11, 12, 13, 14, 15, 16, 17 and 18, and the pad oxide layer 7 may be patterned using a first anisotropic etching process to form a plurality of openings or active holes 31 that expose portions of the buffer layer 4. The first anisotropic etching process may provide a same or substantially similar etch rate with respect to the interlayer insulation layers 21, 22, 23, 24, 25, 26, 27 and 28, the sacrificial layers 11, 12, 13, 14, 15, 16, 17 and 18, and the pad oxide layer 7. That is, during the first anisotropic etching process to form the active holes 31, the interlayer insulation layers 21, 22, 23, 24, 25, 26, 27 and 28, the sacrificial layers 11, 12, 13, 14, 15, 16, 17 and 18, and the pad oxide layer 7 may not have an etch selectivity with respect to each other. The buffer layer 4 may be partially etched due to an over-etch of the first anisotropic etching process, thereby forming recessed regions R in the buffer layer 4. However, the buffer layer 4, i.e., the carbon containing polysilicon layer may exhibit a lower etch rate than a pure silicon layer constituting the substrate 1 during the first anisotropic etching process. Thus, depths of the recessed regions R may be uniform. That is, the active holes or openings 31 may be formed to have a uniform depth.

Figure 26:
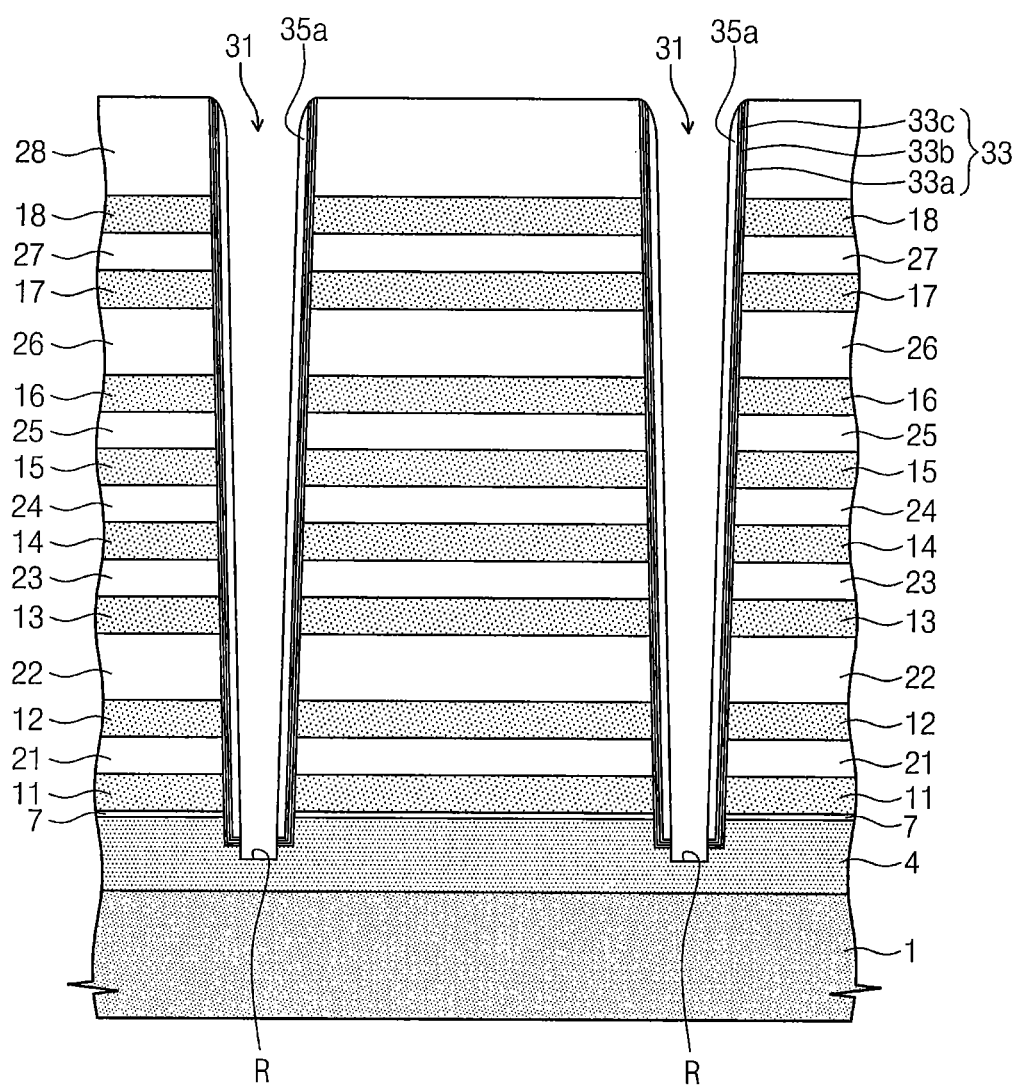

Referring to FIG. 26, a gate insulation layer 33 and a first active layer may be sequentially and conformally formed on sidewalls of the active holes 31. The first active layer and the gate insulation layer 33 may be anisotropically etched to expose a top surface of the topmost interlayer insulation layer (e.g., the eighth interlayer insulation layer 28) as well as portions of the buffer layer 4 and to simultaneously define first sub active patterns 35a and the gate insulation layer 33 covering inner sidewalls of the active holes 31. In each of the active holes 31, the gate insulation layer 33 may be formed to have an "L"-shaped cross section. While the first sub active patterns 35a and the L"-shaped gate insulation layer 33 are formed, the buffer layer 4 may be additionally etched to uniformly increase the depths of the active holes 31.

Figure 27:
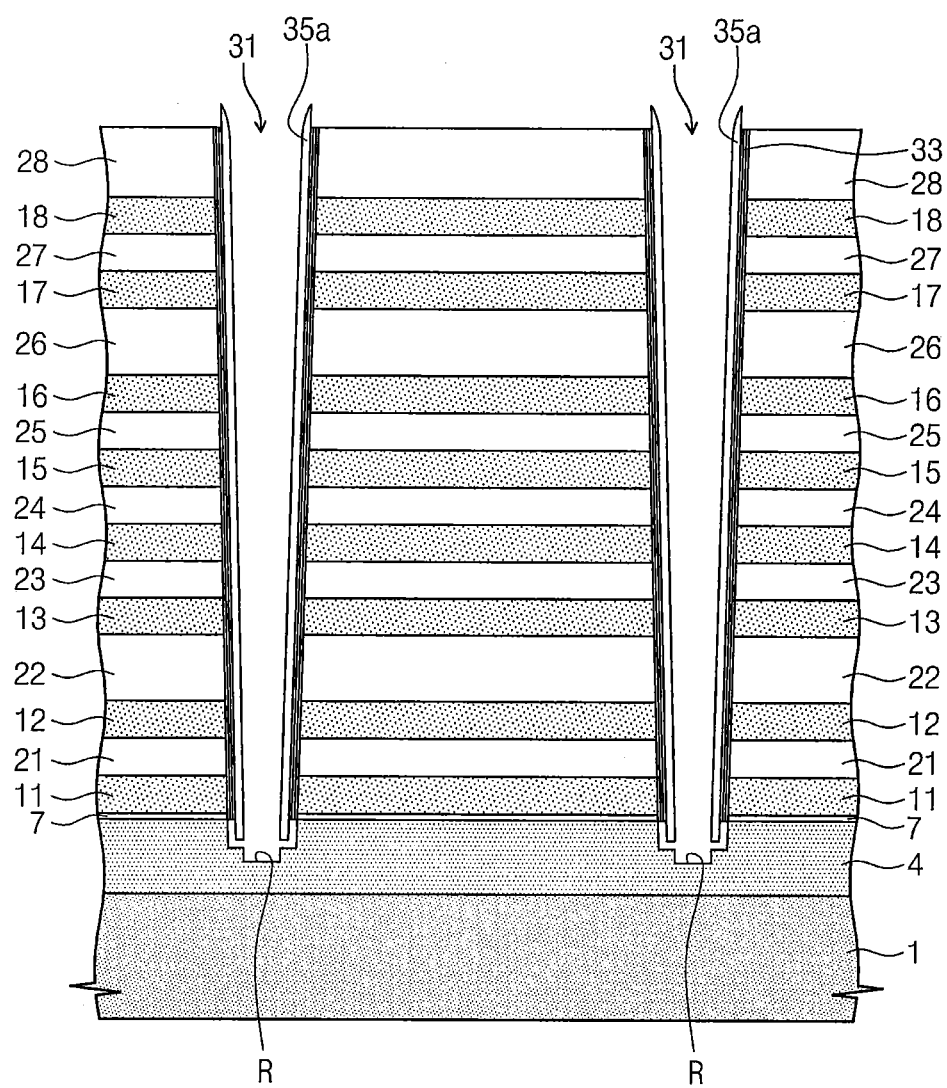

Referring to FIG. 27, lower portions of the gate insulation layers 33, which are interposed between the first sub active patterns 35a and the buffer layer 4, may be removed to expose bottom surfaces and lower outer sidewalls of the first sub active patterns 35a, as well as to simultaneously expose sidewalls of the recessed regions R in the buffer layer 4. The buffer layer 4 may not be further etched while the lower portions of the gate insulation layers 33 are removed in some embodiments.

Figure 28:
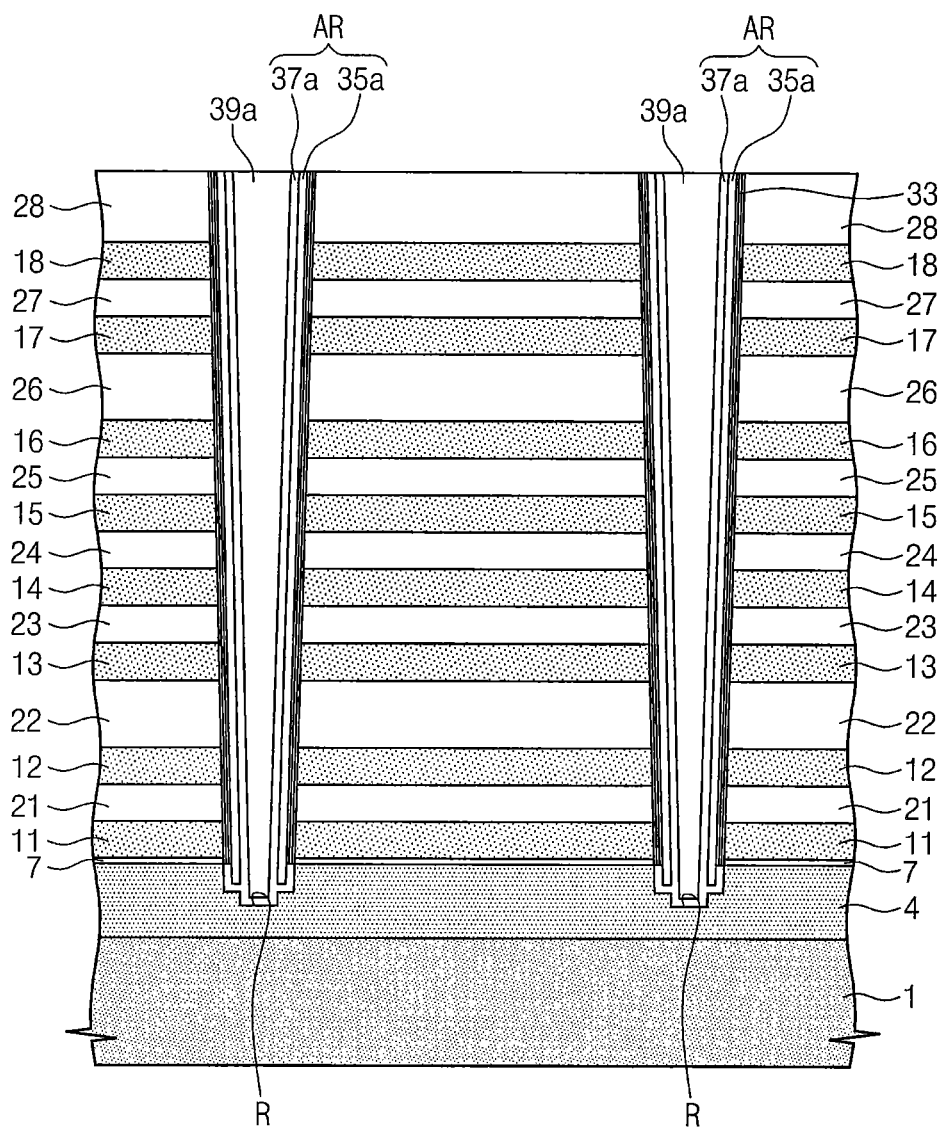

Referring to FIG. 28, a second active layer may be conformally formed on the substrate where the lower portions of the gate insulation layers 33 are removed. An inner insulation layer may be formed on the second active layer to substantially fill the active holes 31. The inner insulation layer and the second active layer may be planarized to expose the top surface of the eighth interlayer insulation layer 28 and to simultaneously form second sub active patterns 37a and inner insulation patterns 39a in the active holes 31. The first sub active pattern 35a and the second sub active pattern 37a in each of the active holes 31 may define an active pattern AR. Subsequently, the three dimensional semiconductor device shown in FIG. 24 may be completed using the same or similar processes as described with reference to FIGS. 12 to 17.

Figure 29:
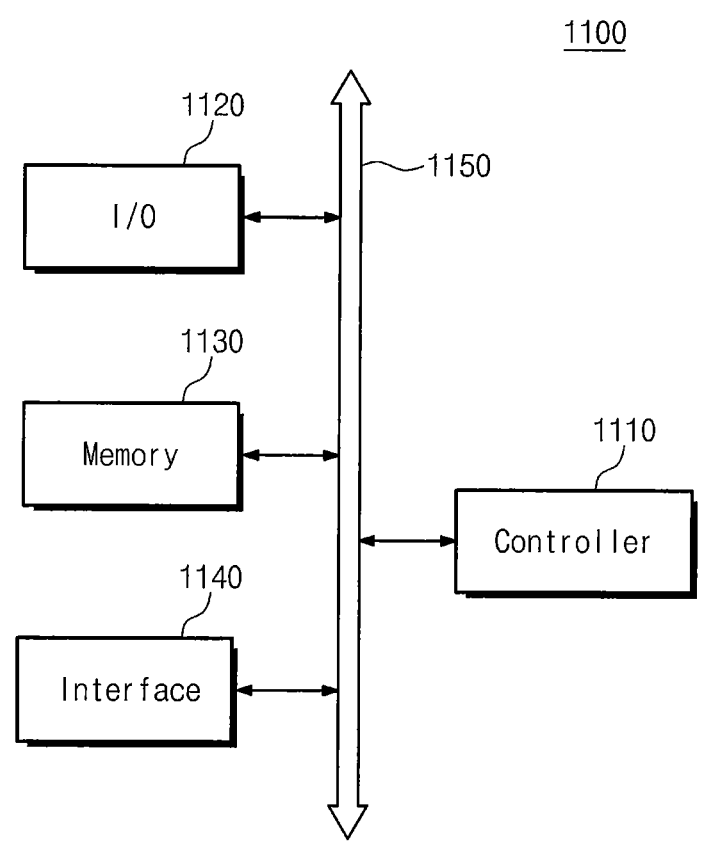
FIG. 29 is a block diagram illustrating an example of electronic systems including at least one three-dimensional semiconductor device according to embodiments described herein.

FIG. 29 is a schematic block diagram illustrating an example of electronic systems including the three dimensional semiconductor devices according to embodiments described herein.

Referring to FIG. 29, an electronic system 1100 according to some embodiments may be applied to a personal digital assistant (PDA), a portable computer, a web tablet, a wireless phone, a mobile phone, a digital music player, and/or a memory card. The electronic system 1100 may also be applied to another electronic product that wirelessly receives or transmits information or data.

The electronic system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one microprocessor, a digital signal processor (DSP), a microcontroller, and/or a logic device. The logic device may have a similar function to any one of the microprocessor, the digital signal processor and the microcontroller. The memory device 1130 may store commands executed by the controller 1110. The I/O unit 1120 may receive data or signals from external devices or may output data or signals to external device. The I/O unit 1120 may include a keypad, a keyboard and/or a display unit.

The memory device 1130 may include at least one of the semiconductor devices described in the above embodiments. The memory device 1130 may further include another type of semiconductor memory device which is different from the semiconductor devices described in the above embodiments. For example, the memory device 1130 may further include a volatile memory device. The interface unit 1140 may transmit electrical data to a communication network or may receive electrical data from a communication network.

Figure 30:
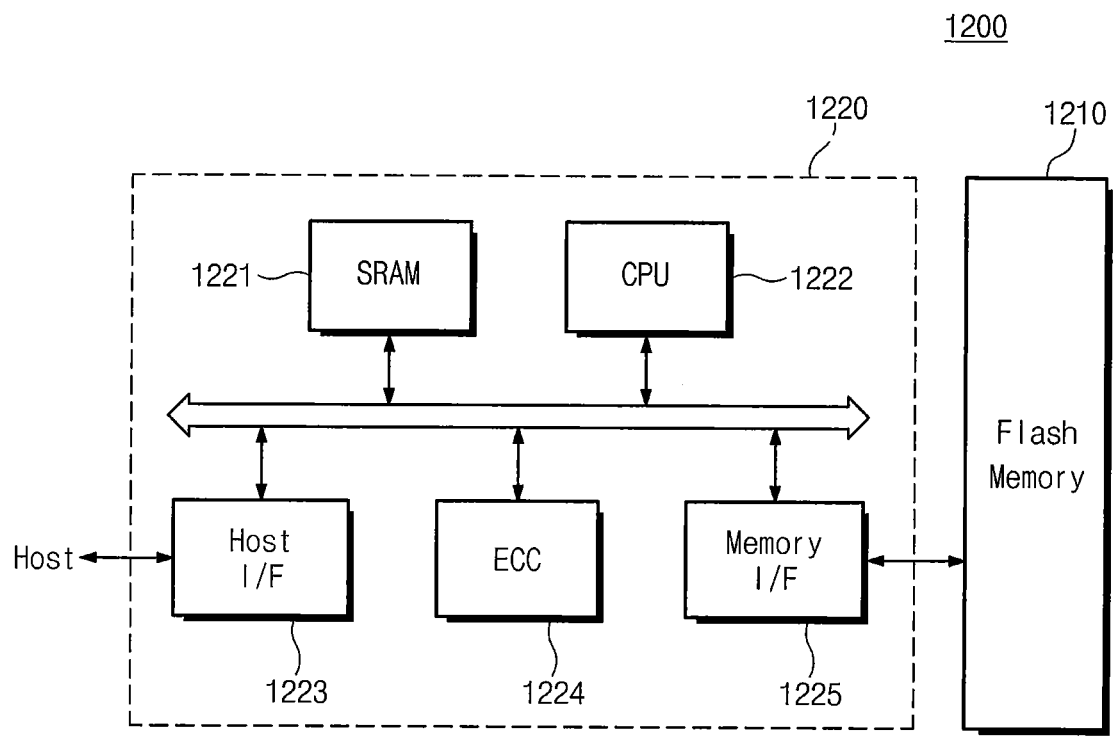
FIG. 30 is a block diagram illustrating an example of memory cards including at least one three-dimensional semiconductor device according to embodiments described herein.

FIG. 30 is a block diagram illustrating an example of memory cards including the three dimensional semiconductor devices according to embodiments described herein.

Referring to FIG. 30, a memory card 1200 for storing a large capacity of data may include a flash memory device 1210, such as a NAND flash memory device. The flash memory device 1210 may include at least one three dimensional semiconductor device according to the embodiments described herein. The memory card 1200 may include a memory controller 1220 that controls overall data communication between a host and the flash memory device 1210.

The memory controller 1220 may include a central processing unit (CPU) 1222, a static random access memory (SRAM) device 1221, a host interface unit 1223, an error check and correction (ECC) block 1224, and a memory interface unit 1225.

The SRAM device 1221 may be used as an operation memory of the CPU 1222. The host interface unit 1223 may be configured to include a data communication protocol of the host connected to the memory card 1200. The ECC block 1224 may detect and/or correct errors of data which are read out from the flash memory device 1210. The memory interface unit 1225 may control the communication between the memory controller 1220 and the flash memory device 1210. The central processing unit (CPU) 1222 may control overall operations for data communication of the memory controller 1220. The memory card 1200 may further include a read only memory (ROM) device that stores code data used to interface with the host.

With regard to the memory card and/or the electronic system described above, a highly reliable electronic system may be realized using the flash memory device 1210 that has improved erasure characteristics. In particular, when the flash memory devices according to the embodiments are employed in a solid state disk (SSD), reliability of the SSD may be improved.

Figure 31:
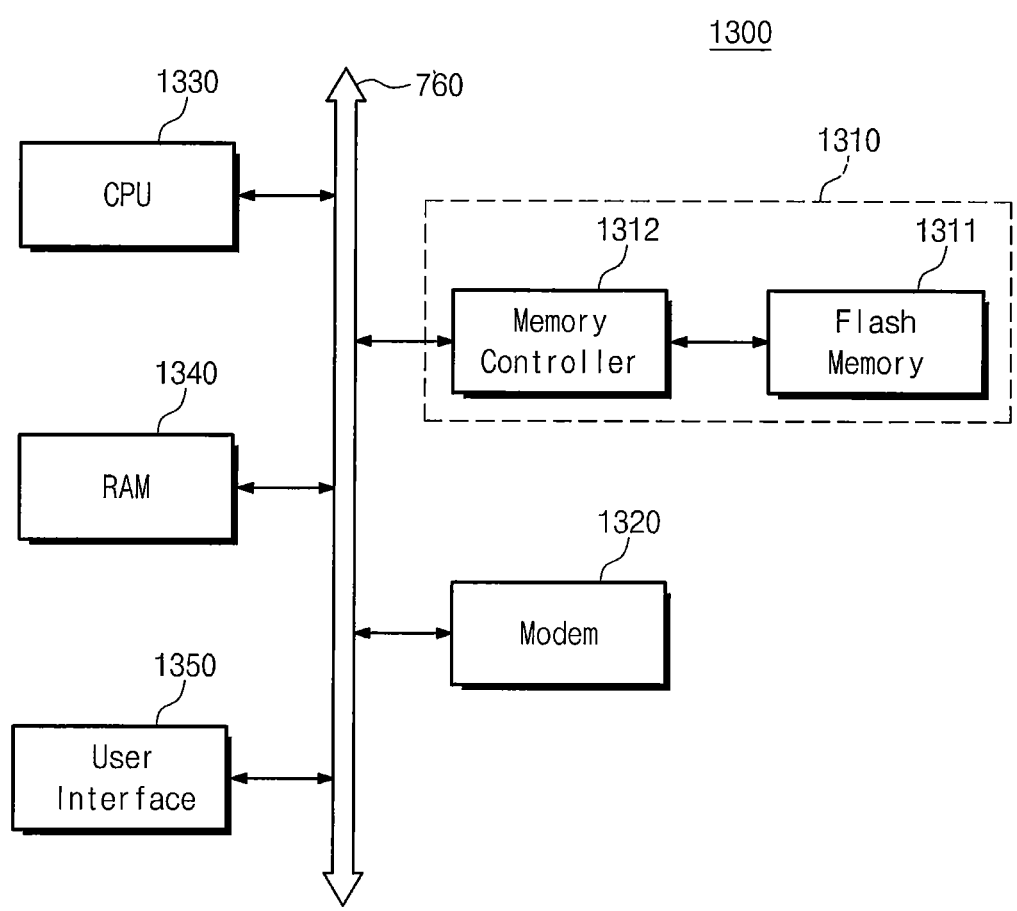
FIG. 31 is a block diagram illustrating an example of information processing systems including at least one of the three-dimensional semiconductor devices according to embodiments described herein.

FIG. 31 is a block diagram illustrating an example of information processing systems including the three dimensional semiconductor devices according to embodiments described herein.

Referring to FIG. 31, an information processing system 1300 may be applied to a mobile system and/or a desktop computer. The information processing system 1300 may include a flash memory system 1310, a modulator-demodulator (MODEM) 1320, a central processing unit (CPU) 1330, a random access memory (RAM) device 1340 and a user interface unit 1350 that communicate with each other through a data bus 760. The flash memory system 1310 may have substantially the same configuration as the memory card 1200 illustrated in FIG. 30. The flash memory system 1310 may store data processed by the CPU 1330 and/or data transmitted from an external system. The flash memory system 1310 may be composed of a solid state disk (SSD). In this case, the flash memory system 1310 of the information processing system 1300 may stably store a large capacity of data to improve reliability of the information processing system 1300. As the reliability of the information processing system 1300 is improved, the operations or processes for correcting errors generated in the flash memory system 1310 may be reduced to improve the operating time or speed of the information processing system 1300. Thus, the information processing system 1300 may allow for faster data communication. The information processing system 1300 may further include an application chipset, a camera image processor and/or an input/output unit.

The flash memory devices according to the exemplary embodiments described above may be encapsulated using various packaging techniques. For example, the flash memory device according to the aforementioned exemplary embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique.

According to the embodiments set forth above, vertically extending active patterns can be formed to have a uniform height due to the presence of a buffer layer on a substrate. Thus, a uniformity of the cell currents flowing through the vertical active patterns can be improved. As a result, highly reliable three dimensional semiconductor devices can be realized. Further, common source lines may be insulated from the substrate by a buried insulation layer therebetween. Thus, leakage current characteristics of the three dimensional semiconductor device can be improved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a three-dimensional semiconductor device, the method comprising:
   forming a buffer layer on a substrate;
   alternately forming sacrificial layers and interlayer insulation layers on the buffer layer;
   patterning at least the sacrificial layers and the interlayer insulation layers to form respective openings extending into the buffer layer;
   forming gate insulation layers on sidewalls of the respective openings;
   removing lower portions of the gate insulation layers to expose lower sidewalls of the respective openings;
   forming an active layer in the respective openings to define respective active patterns therein; and
   replacing the sacrificial layers with conductive layers.

2. The method of claim 1, wherein forming the buffer layer includes forming a buried insulation layer on the substrate and forming a semiconductor layer on the buried insulation layer, and
   wherein forming the openings includes patterning the sacrificial layers, the interlayer insulation layers and the semiconductor layer to expose the buried insulation layer.

3. The method of claim 2, wherein patterning comprises:
   performing a first anisotropic etch of the interlayer insulation layers and the sacrificial layers and the semiconductor layer to define preliminary openings extending into the semiconductor layer to non-uniform depths; and
   performing a second anisotropic etch of the semiconductor layer through the preliminary openings to expose the buried insulation layer and form the respective openings to substantially uniform depths.

4. The method of claim 2, wherein the buried insulation layer is etched to form undercut regions in the buried insulation layer during removing the lower portions of the gate insulation layers, and wherein the active layer is formed on inner surfaces of the undercut regions.

5. The method of claim 1, wherein the buffer layer is formed of a polysilicon layer doped with carbon.

* * * * *